United States Patent
Taniguchi et al.

(10) Patent No.: US 6,404,101 B1
(45) Date of Patent: Jun. 11, 2002

(54) SURFACE ACOUSTIC WAVE DEVICE

(75) Inventors: Norio Taniguchi, Shiga-ken; Toshiaki Takata; Tatsurou Nagai, both of Kanazawa; Shuji Yamato, Ishikawa-ken, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/953,720

(22) Filed: Sep. 17, 2001

(30) Foreign Application Priority Data

Sep. 25, 2000 (JP) .................................. 2000-290661

(51) Int. Cl.⁷ ............................................. H01L 41/04
(52) U.S. Cl. ............................. 310/313 A; 310/313 B; 310/313 R; 310/364
(58) Field of Search ........................ 310/313 R, 313 B, 310/313 C, 313 D, 363, 364; 333/193–196, 150–155

(56) References Cited

U.S. PATENT DOCUMENTS

| | | | | |
|---|---|---|---|---|
| 3,446,974 A | * | 5/1969 | Seiwatz | ................... 310/313 B |
| 3,689,784 A | * | 9/1972 | De Klerk | ................. 310/313 B |
| 3,706,055 A | * | 12/1972 | Dieulesaint et al. | .... 310/313 B |
| 4,495,431 A | * | 1/1985 | Grudkowski | ............ 310/313 B |
| 5,215,546 A | * | 6/1993 | Cho et al. | ................ 310/313 B |
| 6,072,377 A | * | 6/2000 | Tajima et al. | ................ 333/154 |
| 6,257,048 B1 | * | 7/2001 | Hietala et al. | .............. 73/24.01 |
| 6,259,185 B1 | * | 7/2001 | Lai | ......................... 310/313 B |
| 6,291,924 B1 | * | 9/2001 | Lau et al. | ................ 310/313 R |

* cited by examiner

Primary Examiner—Mark O. Budd
(74) Attorney, Agent, or Firm—Keating & Bennett, LLP

(57) ABSTRACT

A surface acoustic wave device is arranged such that surface acoustic wave energy is trapped substantially perpendicularly to the surface acoustic wave propagation direction. At least one interdigital transducer having a plurality of electrode fingers and first and second bus bar electrodes is located on a piezoelectric substrate on which a surface acoustic wave is excited, and has an anisotropy index γ of less than about −1 in the propagation direction. The electrode fingers each have a film thickness of not less than about 0.04 λ in which λ is the wavelength of the surface acoustic wave. At least a portion of the first and second bus bar electrodes have a thickness that is larger than that of each electrode finger.

38 Claims, 15 Drawing Sheets

SURFACE ACOUSTIC WAVE DEVICE

BACKGROUND OF THE INVENTION

1. Field of the Invention

The present invention relates to a surface acoustic wave device such as a surface acoustic wave filter for use as a band filter in mobile communications equipment.

2. Description of the Related Art

Surface acoustic wave filters are more widely used as band filters in mobile communications equipment, since the filters can be reduced in size, in contrast to dielectric filters or other filters. The band filters for use in mobile communications equipment are required to have a low loss in the transmission bands. Accordingly, the surface acoustic wave filters have been variously designed and constructed to reduce the loss.

For example, a surface acoustic wave filter using one terminal-pair surface acoustic wave resonator shown in FIG. 15A has been proposed. Here, grating reflectors 202 and 203 each having a plurality of electrode fingers, are arranged on both of the sides in the surface acoustic wave propagation direction of an interdigital transducer 201. The loss in the transmission band of the one terminal pair surface acoustic wave resonator is reduced by the grating reflectors 202 and 203.

Moreover, a surface acoustic wave resonator having only one interdigital transducer 205 has been proposed as shown in FIG. 15B. Here, the number of electrodes in the interdigital transducer 205 is large, for example, 200 electrodes. Thereby, surface acoustic wave energy can be trapped in the area where the interdigital transducer 205 is located without reflectors being provided. That is, a multi-pair type energy trapping surface acoustic wave resonator is formed.

Furthermore, a plurality of interdigital transducers 206 and 207 are arranged in the surface acoustic wave propagation direction in the resonator type surface acoustic wave filter shown in FIG. 16C. Grating reflectors 208 and 209 are arranged on both sides in the surface acoustic wave propagation direction of the area where the interdigital transducers 206 and 207 are located, respectively.

Moreover, a surface acoustic wave filter having a ladder circuit configuration and a surface acoustic wave filter having a lattice circuit configuration, in each of which a combination of plural surface acoustic wave resonators is provided as described above and shown in FIGS. 15A and 15B, have been proposed.

As described above, the energy of an excited surface acoustic wave can be trapped by providing reflectors, or by increasing the number of the electrode finger pairs of an interdigital transducer. Thus, the Q value, which is a resonance characteristic, can be enhanced, and the loss can be reduced.

On the other hand, the electrode resistance of a surface acoustic wave device, the surface acoustic wave mode, the electrode capacity, and so forth are affected by the ratio of the width L1 of each electrode finger 211 in an interdigital transducer shown in FIG. 17, based on the gap size L2 between adjacent electrode fingers 211 in the surface acoustic wave propagation direction in the interdigital transducer, that is, the ratio of L1/(L1+L2) (hereinafter, referred to as duty, briefly), and moreover, the electrode film thickness h/$\lambda$ of the interdigital transducer ($\lambda$ is the wavelength of a surface acoustic wave, and h/$\lambda$ is a film thickness standardized by $\lambda$. Thus, for design of the surface acoustic wave device, it is important to optimize these parameters.

The gap length L2 represents the distance in the surface acoustic wave propagation direction of the gap.

As described above, conventionally, surface acoustic wave filters have been variously designed so as to enhance the filter characteristics. For example, Japanese Unexamined Patent Application Publication No. 7-28368 discloses a longitudinally coupled resonator type surface acoustic wave filter using a 36° Y-cut X-directional propagation LiTaO$_3$ piezoelectric substrate and moreover, utilizing coupling of modes in the horizontal direction relative to the surface acoustic wave propagation path. According to this publication, the ohmic resistance loss can be reduced, and the steepness of the filter characteristic can be increased by setting the electrode film thickness of the interdigital transducer to be in the range of 0.06 $\lambda$ to 0.10 $\lambda$, and also, setting the duty of the interdigital transducer at about 0.6 or higher.

On the other hand, Japanese Unexamined Patent Application Publication No. 6-188673 discloses a ladder surface acoustic wave filter in which plural one terminal-pair surface acoustic wave resonators are formed on a 36° Y-cut X-directional propagation LiTaO$_3$ substrate. FIG. 18 shows the ladder circuit. In FIG. 18, S1 and S2 represent series arm resonators, and P1 to P3 represent parallel arm resonators, respectively. In this conventional surface acoustic wave filter, the electrode film thickness h/$\lambda$ of the interdigital transducer is in the range of 0.4 $\lambda$ to 0.10 $\lambda$, whereby an undesired spurious can be removed from the transmission band to improve the filter characteristic.

According to the above-described publications, the resistance loss can be reduced, and the spurious suppressing effect can be obtained by setting the film thickness of the interdigital transducer at 0.04 $\lambda$ or more and setting the duty at 0.5 or higher when the 36° Y-cut X-directional propagation LiTaO$_3$ is used.

Recently, mobile communication systems have been operated at higher frequencies, and the frequencies at which surface acoustic wave filters are operated in the systems become higher, that is, the frequencies are in the range of 800 MHz to 2.5 GHz. The acoustic velocities of surface acoustic waves are about several thousand meters per second. Thus, when a surface acoustic wave device is formed so as to operate at 800 MHz to 2.5 GHz, the wavelength of a surface acoustic wave is short, that is, about several $\mu$m. Accordingly, electrode patterns for defining the interdigital transducers and the reflectors must be very fine.

Therefore, the absolute value of the electrode film thickness become small, and the width of each electrode finger become small. As a result, the loss (ohmic loss), caused by the electrode resistance, cannot be made negligible.

Moreover, when the thickness of each electrode becomes small, the strength of the electrode is reduced. Accordingly, electrodes that are capable of being wire-bonded cannot be formed.

Thus, it has been attempted that the film thickness of portions of the electrodes, such as bus bar electrodes, turning-around electrodes, and wire bonding pads, excluding the electrode portions where a surface acoustic wave is excited in practice, is increased to reduce the ohmic loss as much as possible, whereby the strength required for wire-bonding is secured.

For example, Japanese Unexamined Patent Application Publication No. 62-47206 discloses a surface acoustic wave filter in which acoustic coupling of the component of a surface acoustic wave in the vertical direction to the surface acoustic wave propagation direction is caused. As described in this publication, in this surface acoustic wave filter, the thickness of each of the bas bar electrodes shared by the interdigital transducers adjacent to each other in the surface acoustic wave propagation direction is larger than that of each electrode finger of the interdigital transducers. Thus, the acoustic velocity can be controlled while the resistance is reduced. Therefore, a desirable filter characteristic can be obtained.

In the surface acoustic wave resonators shown in FIGS. 15A and 15B and in the resonator type surface acoustic wave filter shown in FIG. 16, the energy can be trapped by increasing the number of the electrode fingers of the reflectors, and increasing the number of electrode pairs of the interdigital transducer to reflect the surface acoustic wave substantially completely. However, the surface acoustic wave has not only an X-directional component but also a component in the vertical direction to the X-direction, that is, a Y-directional component in the vertical direction to the main plane of the piezoelectric substrate. Thus, the surface acoustic wave propagates while the Y-directional component extends in a beam shape. For this reason, it is necessary to sufficiently trap the energy of the surface acoustic wave in the Y-axial direction. Unless the energy is not sufficiently trapped, the diffraction loss will increase, so that the Q value is deteriorated.

As described in the Journal of the Acoustical Society of Japan, 3-1-1, 77–78 (1979/6), the anisotropy index γ is less than −1 on a 36° Y-cut propagation LiTaO$_3$. The anisotropy index γ is a constant in the following formula by which the acoustic velocity (θ), obtained when the propagation direction is deviated by an angle θ from the X-axis, is expressed. In the formula, V0 is the acoustic velocity when θ is 0°.

$$V(\theta)=V0 \times (1+\gamma/2 \times \theta^2)$$

In the case in which the anisotropy index γ is less than −1, the energy is trapped when the velocity in the wave guide is lower than that outside the wave guide. That is, Vs/Vm>1 is the condition required for energy trapping, in which Vs is the velocity of a surface acoustic wave in the area where the electrode fingers are provided, and Vm is the velocity of the surface acoustic wave propagating on each bus bar electrode.

On the other hand, it has been found that the ratio Vs/Vm, that is, the ratio of Vs representing the velocity of a surface acoustic wave propagating on the area where the electrode fingers are meshed with each other, to Vm representing the velocity of the surface acoustic wave propagating on each bus bar electrode is significantly varied depending on the duty and the electrode film thickness, when the film thickness of the electrode fingers and that of the bus bar electrode are equal to each other.

In particular, when the electrode film thickness is small, and the duty is low, the ratio Vs/Vm>1 is satisfied. When the electrode film thickness and also the duty are increased, the ratio Vs/Vm is decreased. The ratio Vs/Vm reaches Vs=Vm on a certain condition. When the duty or the electrode film thickness is further increased, the ratio Vs/Vm becomes less than 1. That is, substantially no energy can be trapped in the Y-axial direction.

FIG. 19 shows a relationship between the electrode film thickness h/λ and the ratio Vs/Vm, obtained when the interdigital transducer made of Al is formed on a 36° Y-cut X-directional propagation LiTaO$_3$ substrate, and the duty is 0.5. As seen in FIG. 19, the ratio Vs/Vm has a maximum value when the electrode film thickness h/λ is in the range of 3% to 4%, namely, in the range of 0.03 to 0.04. When the electrode film thickness h/λ become larger, the ratio Vs/Vm is decreased, changing along the parabolic curve. Especially, it is observed that the ratio Vs/Vm is rapidly decreased when the electrode film thickness h/λ exceeds 0.06 λ.

If the length in the Y-axial direction of each bus bar electrode is infinite, the energy can be trapped, provided that the ratio Vs/Vm is less than 1. In the case in which the length in the Y-axial direction of each of the bus bars is definite, the energy trapping effect will be reduced, if the ratio Vs/Vm is not sufficiently large. Thus, the loss in the filter characteristic is increased.

FIG. 20 shows a relationship between the duty and the ratio Vs/Vm, obtained when the interdigital transducer is made of Al, and the electrode film thickness is constant, that is, 0.06 λ on a 36° Y-cut X-directional propagation LiTaO$_3$ substrate.

As seen in FIG. 20, when the duty is low, the ratio Vs/Vm is large. As the duty is increased, the ratio Vs/Vm is reduced. Especially, when the duty exceeds 0.8, the ratio Vs/Vm becomes less than 1. Thus, the energy trapping condition is not satisfied.

Furthermore, the following Table 1 shows change of the ratio Vs/Vm, obtained when the duty and the electrode film thickness are varied.

TABLE 1

| | | duty | | | | | | | | |
|---|---|---|---|---|---|---|---|---|---|---|
| | | 0.4 | 0.45 | 0.5 | 0.55 | 0.6 | 0.65 | 0.7 | 0.75 | 0.8 |
| electrode film thickness (h/λ) % | 1 | 1.0111 | 1.0098 | 1.0084 | 1.0071 | 1.0058 | 1.0047 | 1.0035 | 1.0026 | 1.0016 |
| | 1.5 | 1.0114 | 1.0100 | 1.0086 | 1.0073 | 1.0060 | 1.0048 | 1.0036 | 1.0026 | 1.0016 |
| | 2 | 1.0116 | 1.0102 | 1.0089 | 1.0075 | 1.0062 | 1.0050 | 1.0037 | 1.0027 | 1.0017 |
| | 2.5 | 1.0118 | 1.0103 | 1.0089 | 1.0076 | 1.0062 | 1.0050 | 1.0037 | 1.0027 | 1.0016 |
| | 3 | 1.0119 | 1.0105 | 1.0090 | 1.0076 | 1.0062 | 1.0050 | 1.0037 | 1.0027 | 1.0016 |
| | 3.5 | 1.0120 | 1.0105 | 1.0090 | 1.0075 | 1.0061 | 1.0048 | 1.0036 | 1.0025 | 1.0014 |
| | 4 | 1.0121 | 1.0105 | 1.0090 | 1.0075 | 1.0060 | 1.0047 | 1.0034 | 1.0023 | 1.0012 |
| | 4.5 | 1.0120 | 1.0104 | 1.0088 | 1.0073 | 1.0058 | 1.0044 | 1.0031 | 1.0020 | 1.0008 |
| | 5 | 1.0119 | 1.0102 | 1.0086 | 1.0070 | 1.0055 | 1.0042 | 1.0028 | 1.0016 | 1.0004 |
| | 5.5 | 1.0118 | 1.0110 | 1.0083 | 1.0067 | 1.0051 | 1.0037 | 1.0023 | 1.0011 | 0.9999 |
| | 6 | 1.0116 | 1.0098 | 1.0079 | 1.0063 | 1.0046 | 1.0032 | 1.0018 | 1.0006 | 0.9994 |
| | 6.5 | 1.0112 | 1.0092 | 1.0073 | 1.0056 | 1.0039 | 1.0024 | 1.0009 | 0.9997 | 0.9986 |
| | 7 | 1.0107 | 1.0087 | 1.0067 | 1.0050 | 1.0032 | 1.0016 | 0.9999 | 0.9988 | 0.9977 |
| | 7.5 | 1.0103 | 1.0082 | 1.0061 | 1.0042 | 1.0023 | 1.0007 | 0.9992 | 0.9980 | 0.9968 |
| | 8 | 1.0099 | 1.0077 | 1.0054 | 1.0034 | 1.0014 | 0.9999 | 0.9984 | 0.9972 | 0.9960 |
| | 8.5 | 1.0091 | 1.0070 | 1.0049 | 1.0025 | 1.0001 | 0.9985 | 0.9969 | 0.9956 | 0.9944 |
| | 9 | 1.0083 | 1.0063 | 1.0043 | 1.0015 | 0.9987 | 0.9971 | 0.9954 | 0.9941 | 0.9928 |

TABLE 1-continued

| | duty | | | | | | | | |
|---|---|---|---|---|---|---|---|---|---|
| | 0.4 | 0.45 | 0.5 | 0.55 | 0.6 | 0.65 | 0.7 | 0.75 | 0.8 |
| 9.5 | 1.0075 | 1.0056 | 1.0037 | 1.0005 | 0.9972 | 0.9955 | 0.9939 | 0.9925 | 0.9912 |
| 10 | 1.0066 | 1.0049 | 1.0031 | 0.9994 | 0.9957 | 0.9940 | 0.9923 | 0.9909 | 0.9896 |

As seen in TABLE 1, as the film thickness and the duty are increased, the ratio Vs/Vm is decreased. Especially, the ratio Vs/Vm is less than 1 when the relationships satisfying the following formulae (1) to (6) are obtained, that is, in the conditions where the values listed in the columns on the right side from the thick lines in TABLE 1 can be obtained. Thus, the wave mode in the Y-axial direction cannot be satisfied substantially.

$$L1/(L1+L2) \geq 0.55 \text{ and } h/\lambda \geq 0.100 \quad (1)$$

$$L1/(L1+L2) \geq 0.60 \text{ and } h/\lambda \geq 0.090 \quad (2)$$

$$L1/(L1+L2) \geq 0.65 \text{ and } h/\lambda \geq 0.080 \quad (3)$$

$$L1/(L1+L2) \geq 0.70 \text{ and } h/\lambda \geq 0.070 \quad (4)$$

$$L1/(L1+L2) \geq 0.75 \text{ and } h/\lambda \geq 0.065 \quad (5)$$

$$L1/(L1+L2) \geq 0.80 \text{ and } h/\lambda \geq 0.055 \quad (6)$$

In the surface acoustic wave resonators shown in FIGS. 15A and 15B and in the resonator type surface acoustic wave filter shown in FIG. 16, the electrode resistance loss can be reduced, and an undesirable spurious can be eliminated by increasing the electrode film thickness and also the duty. This was estimated to be preferable.

Referring to the energy trapping effect in the Y-axial direction of the surface acoustic wave, the trapping effect becomes maximum at an electrode film thickness of 0.04 λ, and is reduced when the electrode film thickness becomes 0.04 λ or more.

Moreover, similar phenomena are observed when the duty is increased. The energy trapping effect is reduced at a duty of 0.5 or higher.

Especially, the energy trapping condition cannot be satisfied in the range where the relationship between the electrode film thickness and the duty fulfills a certain condition. Thus, the loss in the filter characteristic is increased.

Accordingly, it is preferable that the electrode film thickness is up to 0.04 λ, and the duty is up to 0.5 to obtain the greatest energy trapping effect.

However, when the electrode film thickness is small, and the duty is 0.5 or less, the filter characteristic is deteriorated for a reason other than the above-described one, as seen in the above-described Japanese Unexamined Patent Application Publication No. 7-283682 and the Japanese Unexamined Patent Application Publication No. 6-188673.

In other words, the optimum electrode structure of a surface acoustic wave filter for obtaining the preferred filter characteristic thereof and the optimum electrode structure from the standpoint of the above-described energy trapping effect in the Y-axial direction are different from each other. Both of the electrode structures have a trade-off relationship.

Moreover, Japanese Unexamined Patent Application Publication No. 62-47206 describes that the acoustic coupling degree between the interdigital transducers can be enhanced, and the bandwidth can be increased by increasing the thickness of each bus bar electrode shared by interdigital transducers adjacent to each other in the surface acoustic wave propagation direction to be larger than that of each electrode finger, until the acoustic velocity Vs of the surface acoustic wave propagating on the electrode fingers is equal to the acoustic velocity Vb of the surface acoustic wave propagating on each bus bar electrode.

The above-described phenomena are caused in the configuration of the surface acoustic wave filter in which the interdigital transducers are acoustically coupled to each other perpendicularly to the surface acoustic wave propagation direction. When Vs is equal to Vb, the above-described energy trapping effect in the Y-axial direction is reduced to the contrary.

SUMMARY OF THE INVENTION

In order to overcome the problems described above, preferred embodiments of the present invention provide a surface acoustic wave device which can efficiently trap the energy of an excited surface acoustic wave, and moreover, can reduce the loss and improve the filter characteristic.

According to a first preferred embodiment of the present invention, a surface acoustic wave device includes a piezoelectric substrate at which a surface acoustic wave is excited, having an anisotropy index γ in the propagation direction of less than about −1, and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave, the electrode fingers each having a film thickness of not less than about 0.04 λ in which λ is the wavelength of the surface acoustic wave, at least a portion of the first and second bus bar electrodes having a thickness larger than that of each electrode finger.

According to a second preferred embodiment of the present invention, a surface acoustic wave device includes a piezoelectric substrate at which a surface acoustic wave is excited, having an anisotropy index γ in the propagation direction of less than about −1, and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave, the electrode finger width L1 of the interdigital transducer and the gap length L2 between adjacent electrode fingers in the surface acoustic wave propagation direction satisfying the formula of L1/(L1+L2)≧0.5, at least a portion of the first and second bus bar electrodes having a thickness larger than that of each electrode finger.

According to a third preferred embodiment of the present invention, a surface acoustic wave device includes a piezoelectric substrate at which a surface acoustic wave is excited, having an anisotropy index γ in the propagation direction of less than about −1, and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave, the film thickness h1 of each electrode finger, the electrode finger width L1, the gap length L2 between adjacent electrode fingers in the surface acoustic wave direction, the wavelength λ of the surface acoustic wave satisfying one of the following formulae (1) to (6);

$$L1(L1+L2) \geq 0.55 \text{ and } h/\lambda \geq 0.100 \quad (1)$$

$$L1(L1+L2) \geq 0.60 \text{ and } h/\lambda \geq 0.090 \quad (2)$$

$$L1(L1+L2) \geq 0.65 \text{ and } h/\lambda \geq 0.080 \quad (3)$$

$$L1(L1+L2) \geq 0.70 \text{ and } h/\lambda \geq 0.070 \quad (4)$$

$$L1(L1+L2) \geq 0.75 \text{ and } h/\lambda \geq 0.065 \quad (5)$$

$$L1(L1+L2) \geq 0.80 \text{ and } h/\lambda \geq 0.055 \quad (6)$$

at least a portion of the first and second bus bar electrodes having a thickness larger than that of each electrode finger.

Preferably, at least a portion of the first and second bus bar electrodes have a multi-layer structure in which a plurality of electrode films are laminated to each other, whereby at least a portion of the first and second bus bar electrodes have a thickness larger than that of each electrode finger.

Also, preferably, in each bus bar electrode having a multi-layer structure, the electrode film defining the lowest layer is arranged so as to be connected to the electrode fingers, respectively, and the electrode films defining the second and the succeeding layers are made of a metal different from that used to form the electrode film defining the lowest layer.

Also, preferably, in each bus bar electrode having a multi-layer structure, at least one layer of the electrode films defining the second and the proceeding layers is made of a metal having a relatively high density compared to the electrode film defining the lowest layer.

Also, preferably, in each bus bar electrode having a multi-layer structure, at least one layer of the electrode films defining the second and the proceeding layers has a lower resistivity and a larger thickness compared to the electrode film defining the lowest layer.

Preferably, in each bus bar electrode having a multi-layer structure, an insulating film is disposed between electrode films constituting the multi-layer structure so as to secure electrical connection between the upper and lower electrode films.

Moreover, preferably, in each bus bar electrode having a multi-layer structure, the distance g of the boundary between the bus bar electrode and the electrode fingers in the electrode film of the lowest layer to the edge on the electrode finger side of the electrode film made of Al defining the second layer, and the film thickness M of the electrode film defining the second layer are in the range determining by the formula of M≧0.159g−0.094, in which values of g and M are integral multiples of the wavelength λ of the surface acoustic wave.

Also, preferably, in each bus bar electrode having a multi-layer structure, the film-thickness Ma of the second layer is in the range defined by the formula Ma×(d0/da) ≧0.159g−0.094, in which g is the distance from the boundary between the bus bar electrode and the electrode fingers to the edge on the electrode finger side of the electrode film defining the second layer, Ma is the electrode film thickness of the second layer, the values of g and M are expressed by integral multiples of the wavelength λ of the surface acoustic wave, respectively, the second layer is made of metal excluding Al, da is the density of the meal of the second layer, and d is the density of Al.

According to a fourth preferred embodiment of the present invention, a surface acoustic wave device includes a piezoelectric substrate at which a surface acoustic wave is excited, having an anisotropy index γ in the propagation direction of less than about −1, and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave, the film thickness of the electrode fingers in the interdigital transducer being not less than about 0.04 λ, in which λ is the wavelength of the surface acoustic wave, an insulating film being disposed on each bus bar electrode so that the thickness of the bus bar electrode is larger than that of each electrode finger.

According to a fifth preferred embodiment of the present invention, a surface acoustic wave device includes a piezoelectric substrate at which a surface acoustic wave is excited, having an anisotropy index γ in the propagation direction of less than about −1, and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave, the electrode finger width L1 and the gap length L2 between adjacent electrode fingers in the surface acoustic wave propagation direction satisfying the formula of L1/(L1+L2)≧0.5, an insulating film being disposed on each bus bar electrode so that the thickness of the bus bar electrode is larger than that of each electrode finger.

According to a sixth preferred embodiment of the present invention, a surface acoustic wave device including a piezoelectric substrate at which a surface acoustic wave is excited, having an anisotropy index γ in the propagation direction of less than about −1, and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave, the film thickness h1 of each electrode finger, the electrode finger width L1, the gap length L2 between adjacent electrode fingers in the surface acoustic wave direction, the wavelength λ of the surface acoustic wave satisfying one of the above-described formulae (1) to (6), and further including an insulating film disposed on the bus bar electrode.

Preferably, the surface acoustic wave device according to various preferred embodiments of the present invention further includes an insulating film disposed on the electrode fingers, whereby the thickness of each bus bar electrode portion including the insulating film is larger than the electrode finger portion including the insulating film.

Also, preferably, the piezoelectric substrate at which a surface acoustic wave can be excited, having an anisotropy index γ in the propagation direction of less than about −1 is preferably a LiTaO₃ substrate at which a pseudo surface acoustic wave can be excited, for example, a 36° Y-cut X-directional propagation LiTaO₃ substrate.

According to another preferred embodiment of the present invention, an antenna sharing device includes at least one of the surface acoustic wave devices according to the above-described preferred embodiments of the present invention.

In addition, according to yet another preferred embodiment of the present invention, a communications equipment apparatus includes at least one antenna sharing device according to the preferred embodiment described in the preceding paragraph.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

The present invention will be more apparent from the following description of preferred embodiments of the surface acoustic wave device of the present invention made with reference to the drawings.

Figure 3:
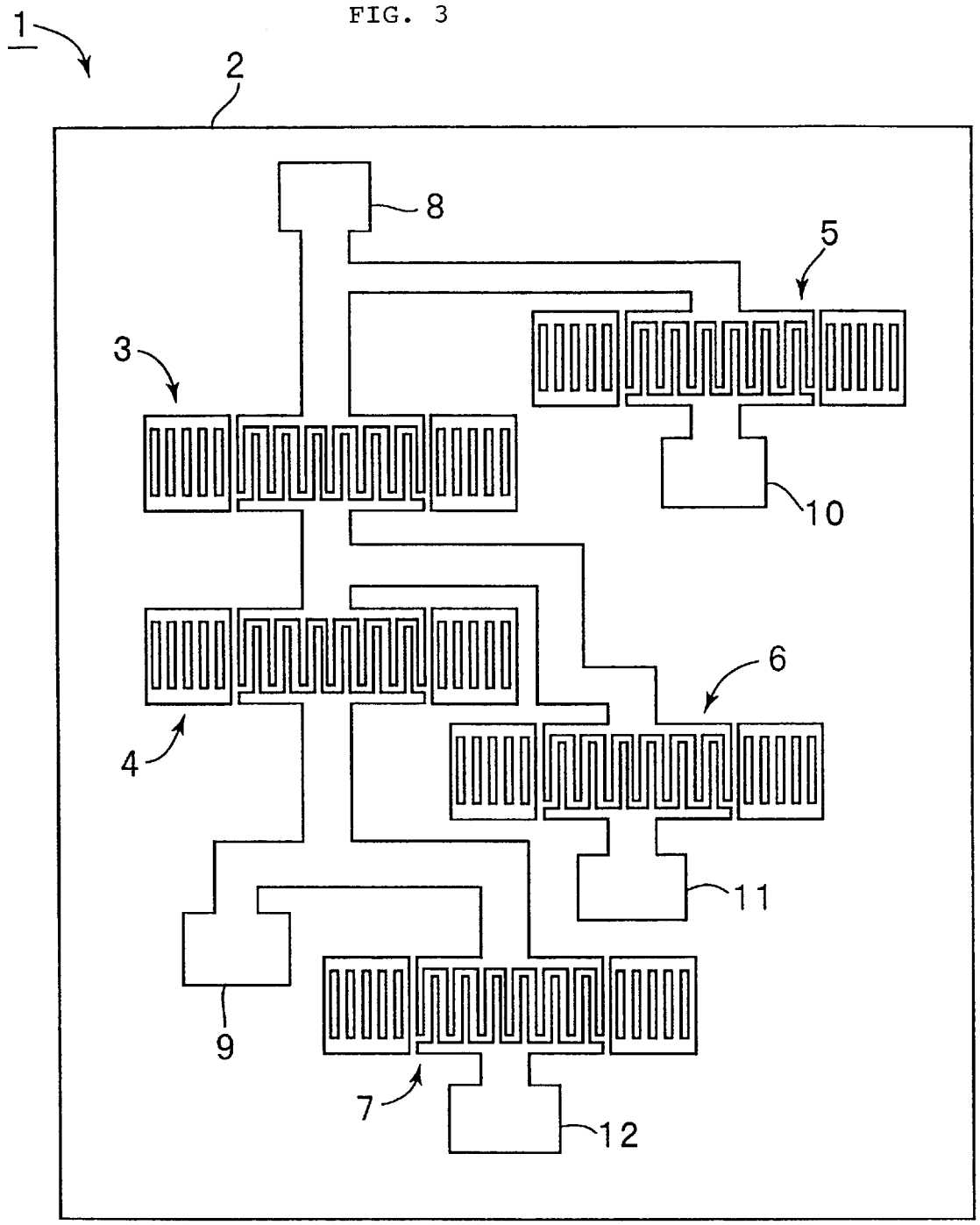
FIG. 3 is a schematic plan view of a surface acoustic wave device according to the first preferred embodiment of the present invention.

FIG. 3 is a schematic plan view of a surface acoustic wave device according to a first preferred embodiment of the present invention. A surface acoustic wave device 1 preferably includes a substantially rectangular piezoelectric substrate 2. The piezoelectric substrate 2 is preferably defined by a 36° Y-cut X-directional propagation $LiTaO_3$ substrate.

A plurality of one terminal-pair surface acoustic wave resonators are arranged on the piezoelectric substrate 2 so as to define a ladder circuit configuration. That is, series arm resonators 3 and 4, parallel arm resonators 5 to 7, electrode pads 8 to 12, and a wiring electrode connecting them are formed by photolithography and an etching process.

In the surface acoustic wave device 1 of this preferred embodiment, the electrode pads 8 and 9 are used as input and output terminals. The series combination of the series arm resonators 3 and 4 is connected to the series arm between the input and output terminals. The electrode pads 10 to 12 are connected to the ground, respectively. The parallel arm resonators 5 to 7 are connected between the series arm and the ground, respectively, to define a ladder filter.

Each of the series arm resonators 3 and 4 and the parallel arm resonators 5 to 7 is a one terminal-pair surface acoustic wave resonator, which includes an interdigital transducer arranged in the approximate center in the surface acoustic wave propagation direction, and grating reflectors arranged on both of the sides in the surface acoustic wave propagation direction of the interdigital transducer.

In this preferred embodiment, the electrode finger meshing width of each of the interdigital transducers of the series arm resonators 3 and 4 is preferably about 50 μm, the number of the electrode pairs is 100, and the number of the electrode fingers of each reflector is 100. The electrode finger pitch in each of the series arm resonators 3 and 4 is preferably about 2.31 μm. Accordingly, the wavelength of a surface acoustic wave is preferably about 4.63 μm. The series arm resonators 3 and 4 preferably have the same configuration as described above.

The parallel arm resonators 5 to 7 preferably have substantially the same configuration. In particular, the electrode finger meshing width of each interdigital transducer is preferably about 55 μm. The number of the electrode finger pairs is 85, and the number of the electrode fingers of each reflector is 100. The electrode finger pitch is about 2.41 μm. That is, the wavelength of the surface acoustic wave is preferably about 2.81 μm.

In the parallel arm resonator 6, the electrode finger meshing width of the interdigital transducer is preferably about 110 µm. The number of the electrode finger pairs is 85, and the number of the electrode fingers of each reflector is 100. The electrode finger pitch is preferably about 2.15 µm (the wavelength of the surface acoustic wave is preferably about 4.30 µm).

It should be pointed out that in FIG. 3, the resonators 3 to 7 are schematically shown, and the number of the electrode fingers and the electrode finger meshing width ratios are different from those of the resonators used in practice, respectively.

The series arm resonators 3 and 4, the parallel arm resonators 5 to 7, the electrode pads 8 to 12, and the wiring electrode connecting them are preferably made of Al. The film thickness of each of these electrodes excluding the bus bar electrodes described below is preferably about 420 nm. The wavelength of a surface acoustic wave on the series arm resonators 3 and 4 is preferably about 4.63 µm. Thus, the ratio (h/λ (%)) of the film thickness of each of the electrode fingers of the interdigital transducers of the series arm resonators 3 and 4 to the wavelength is about 9.1%.

Thus, the wavelength of a surface acoustic wave on the parallel arm resonators 5 and 7 is preferably about 4.81 µm. Thus, the ratio (h/λ (%)) of the film thickness of each of the electrode fingers of the interdigital transducers of the parallel arm resonators 5 and 7 to the wavelength is preferably about 8.7%.

Moreover, the duties of the electrode fingers of the interdigital transducers in the series arm resonators 3 and 4 and the parallel arm resonators 5 to 7 are about 0.5, respectively.

Concerning the bus bar electrodes of the interdigital electrodes in the series arm resonators 3 and 4 and the parallel arm resonators 5 to 7, an electrode film having a thickness of about 840 nm defining the second layer is laminated to each bus bar electrode film made of Al having a thickness of about 420 nm, not shown in FIG. 3. This will be described with reference to FIG. 1.

Figure 1:
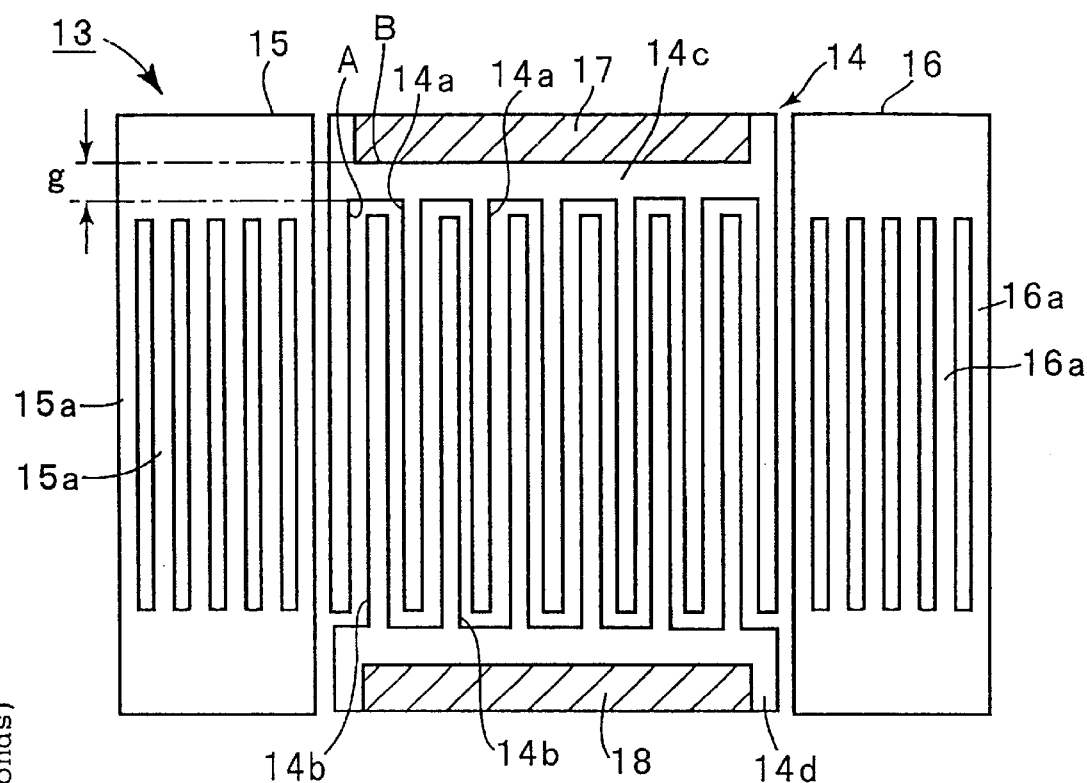
FIG. 1 is a schematic plan view showing the electrode configuration of a one terminal-pair surface acoustic wave resonator according to a first preferred embodiment of the present invention.

FIG. 1 is a plan view showing the electrode configuration of one of the one terminal-pair surface acoustic wave resonators used as the series arm resonators 3 and 4 and the parallel arm resonators 5 to 7. An interdigital transducer 14 is arranged in the center of the one terminal-pair surface acoustic wave resonator 13, and grating reflectors 15 and 16 are arranged on both of the sides in the surface acoustic wave propagation direction of the interdigital transducer 14, respectively. The interdigital transducer 14 contains a plurality of electrode fingers 14a and 14b. A plurality of the electrode fingers 14a and a plurality of the electrode fingers 14b are arranged so as to be interdigitated with each other. The one-side ends of the plurality of the electrode fingers 14a are connected to the bus bar electrode 14c. The plurality of the electrode fingers 14b are electrically connected to the bus bar electrode 14d which is arranged on the opposite side to the bus bar electrode 14c, whereby a pair of comb-shaped electrodes interdigitated with each other are provided.

The reflectors 15 and 16 are arranged so that the both ends of a plurality of electrode fingers 15a and also, the both ends of a plurality of electrode fingers 16a are short-circuited to each other, respectively.

In this preferred embodiment, in the one terminal-pair surface acoustic wave resonators 13 constituting the series arm resonators 3 and 4 and the parallel arm resonators 5 to 7, respectively, electrode films 17 and 18 defining second layers, shown by hatching, are laminated to at least a portion of the bus bar electrodes 14c and 14d, respectively. That is, the bus bar electrodes 14c and 14d each have a multi-layer structure. The second electrode films 17 and 18 are made of Al. Each thickness is preferably about 840 nm. Accordingly, the film-thickness based on the wavelength of the surface acoustic wave is about 17%.

Moreover, the electrode films 17 and 18 defining the second layers are arranged on the bus bar electrodes 14c and 14d so as to be positioned outside the boundaries between the bus bar electrodes 14c and 14d and the electrode fingers 14a and 14b connected to the bus bar electrodes 14c and 14d, substantially perpendicularly to the surface acoustic wave propagation direction, respectively. In other words, the edges B of the electrode films 17 and 18 defining the second layers, which are on the sides of the electrode fingers 14a and 14b, are positioned outside the boundaries A between the bus bar electrodes 14c and 14d and the electrode fingers 14a and 14b substantially perpendicularly to the surface acoustic wave propagation direction, respectively. The distances g between the boundaries A and the edges B are preferably set approximately at 4 µm, that is, at about 0.8 λ to about 0.9 λ, respectively.

The series arm resonators 3 and 4 and the parallel arm resonators 5 to 7 each includes the one terminal-pair surface acoustic wave resonator 13 shown in FIG. 1 in the surface acoustic wave device 1 of this preferred embodiment.

The surface acoustic wave device 1 of this preferred embodiment can be operated as a ladder filter by using the electrode pad 8 as the input terminal and the electrode pad 9 as the output terminal, and connecting the electrode pads 10 to 12 to the ground. The ratio of the film thickness of each of the electrode fingers of the series arm resonators 3 and 4 and the parallel arm resonators 5 and 7 to the wavelength is preferably about 9.1% and 8.7%, respectively. The duty of each interdigital transducer is preferably about 0.5.

Thus, if the film-thickness of each of the electrode fingers 14a and 14b of the interdigital transducer 14 is substantially equal to the film thickness of each of the bus bar electrodes 14c and 14d, the energy trapping effect in the Y-axial direction will be reduced.

However, in this preferred embodiment, the electrode films 17 and 18 defining the second layers are laminated to the bus bar electrodes 14c and 14d, respectively. Accordingly, the acoustic velocity of a surface acoustic wave propagating on the bus bar electrodes 14c and 14d become lower by about 140 m/second.

As a result, the ratio Vs/Vm, that is, the ratio of the acoustic velocity Vs of the surface acoustic wave propagating on the electrode finger meshing area to the propagation velocity Vm of the surface acoustic wave propagating on the bus bar electrodes, is increased. Thus, the energy trapping effect in the Y-axial direction is increased.

Figure 2:
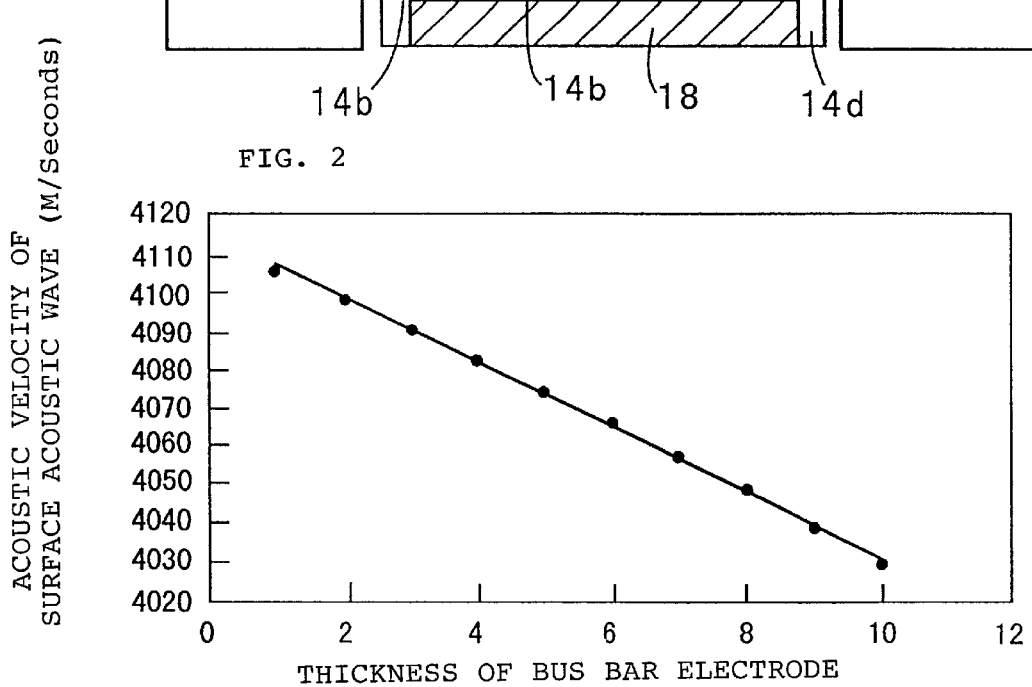
FIG. 2 is a graph showing a relationship between the film thickness of each bus bar electrode and the acoustic velocity Vm of a surface acoustic wave propagating on the bus bar portion.

FIG. 2 is a graph showing changes in the acoustic velocity of a surface acoustic wave propagating on the bus bar electrodes 14c and 14d, obtained when the thickness of the whole of each of the bus bar electrodes 14c and 14d is varied without the electrode films 17 and 18 defining the second layers being formed. The interdigital transducer and the reflectors are formed similarly to the above series arm resonator 3 except that the thickness of each bus bar electrode is varied.

As seen in FIG. 2, when the thickness of each bus bar electrode is increased by about 0.01 λ, in which λ is the wavelength of a surface acoustic wave, the acoustic velocity Vm of the surface acoustic wave becomes lower by about 8.4 m/second.

In this preferred embodiment, the electrode films 17 and 18 defining the second layers are laminated to the bus bar electrodes 14c and 14d, so that the acoustic velocity Vm of a surface acoustic wave propagating on the bus bar electrodes 14c and 14d becomes low. Thereby, the ratio Vs/Vm is set to be less than about 1. Accordingly, the energy trapping in the Y-axial direction can be effectively carried out, and the loss in the filter characteristic can be reduced, as seen in the results of FIG. 2.

Figure 4:
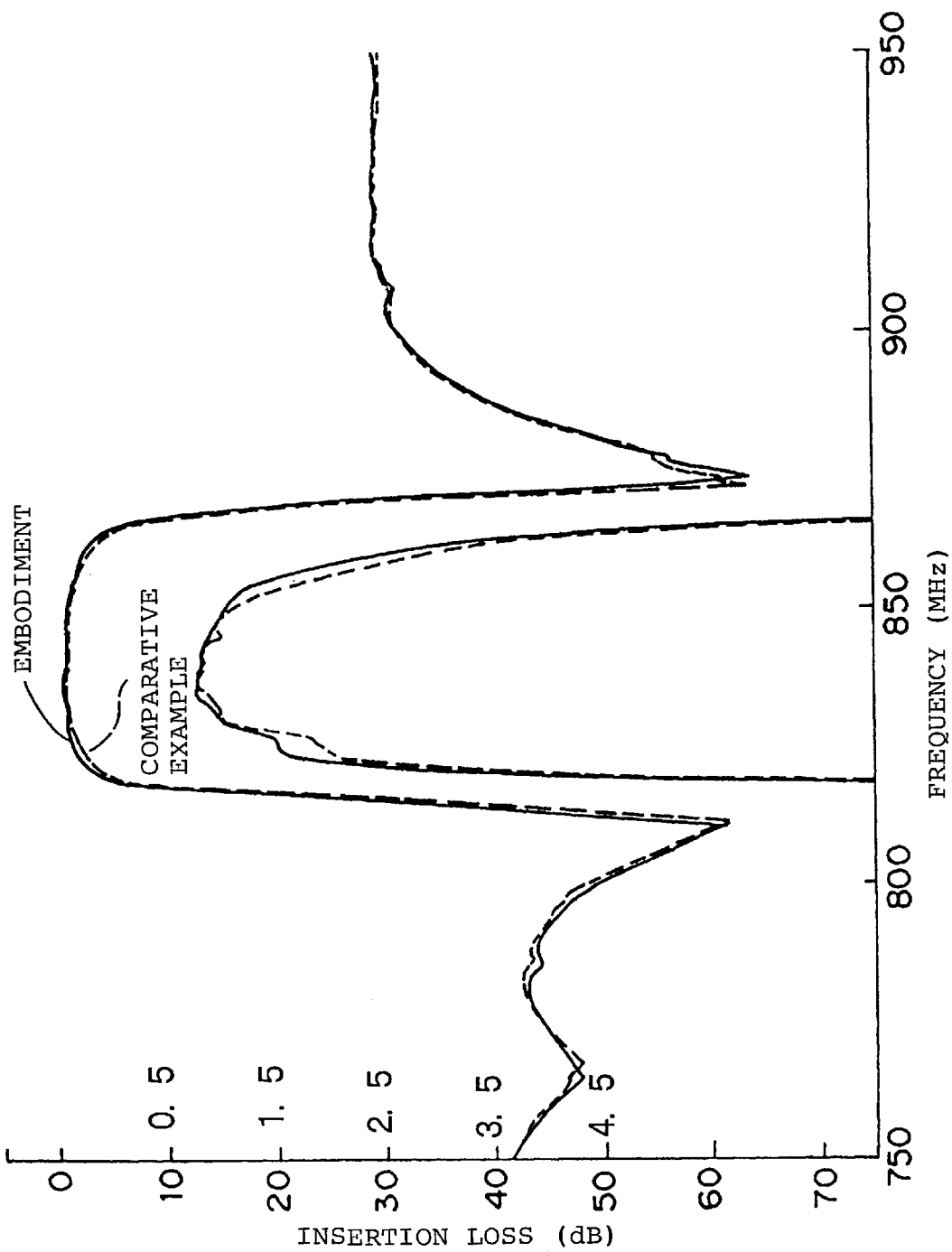
FIG. 4 is a graph showing the filter characteristics of the surface acoustic wave device of the first embodiment and an comparative example thereof.

In FIG. 4, the solid lines show the filter characteristic of the surface acoustic wave device 1 of this preferred embodiment. Moreover, in FIG. 4, the broken lines show the filter characteristic of a comparative example of the surface acoustic wave device configured similarly to that of this preferred embodiment except that the electrode films defining the second layers are not provided. The filter characteristic curves of the insertion losses magnified on the scale shown on the right side of the ordinate are depicted in the lower portion of FIG. 4.

In the surface acoustic wave device of this preferred embodiment, the filter characteristic in the transmission band is considerably improved, although the minimum of the insertion loss is not changed substantially, as seen in FIG. 4. Probably, this is because the multi-layer structures of the bus bar electrodes 14c and 14d reduce the electrode resistance and moreover, significantly improve the surface acoustic wave energy trapping effect.

In this embodiment, the 36° Y-cut X-directional propagation LiTaO$_3$ substrate is used as the piezoelectric substrate. However, a Y-cut X-directional propagation LiTaO$_3$ substrate having another cut angle of about 33° to about 46°, for example, may be used. In this case, similar advantages can be obtained. Furthermore, other appropriate piezoelectric single crystal substrates may be used.

In this preferred embodiment, the electrode films 17 and 18 defining the second layers are also preferably made of Al. The electrode films defining the second layers may be made of a metal material different than that used to form the first layers. Moreover, as the electrode material, not only Al but also Al containing alloys may be preferably used.

Moreover, both of the electrode films defining the first layers and the electrode films defining the second layers may be made of metal other than Al and an Al containing alloy. Moreover, each electrode film itself defining the first layer may be a multi-layer film including a plurality of metal films laminated together.

In this preferred embodiment, each of the distances g from the boundaries A between the bus bar electrodes 14c and 14d and the electrode fingers to the edges B of the electrode films 17 and 18 defining the second layers on the sides of the electrode fingers 14a and 14b is preferably about 4 μm, that is, about 0.8 λ to about 0.9 λ. Thus, sufficient attention should be paid to the gap length g to obtain a satisfactory energy trapping effect.

When the gap length g of each of the series arm resonators and the parallel arm resonators in the surface acoustic wave device 1 of this preferred embodiment is varied, the filter characteristic is changed. The inventor of this patent application has discovered that the energy trapping effect is changed when the gap length g and the film thickness M of each of the electrode films 17 and 18 defining the second layers are varied. Basically, the trapping effect can be obtained when each electrode film thickness of the reflectors is larger than that of each bus bar. However, if the gap length g is excessively larger, sufficient trapping effects can not be obtained in some cases.

Figure 5A:
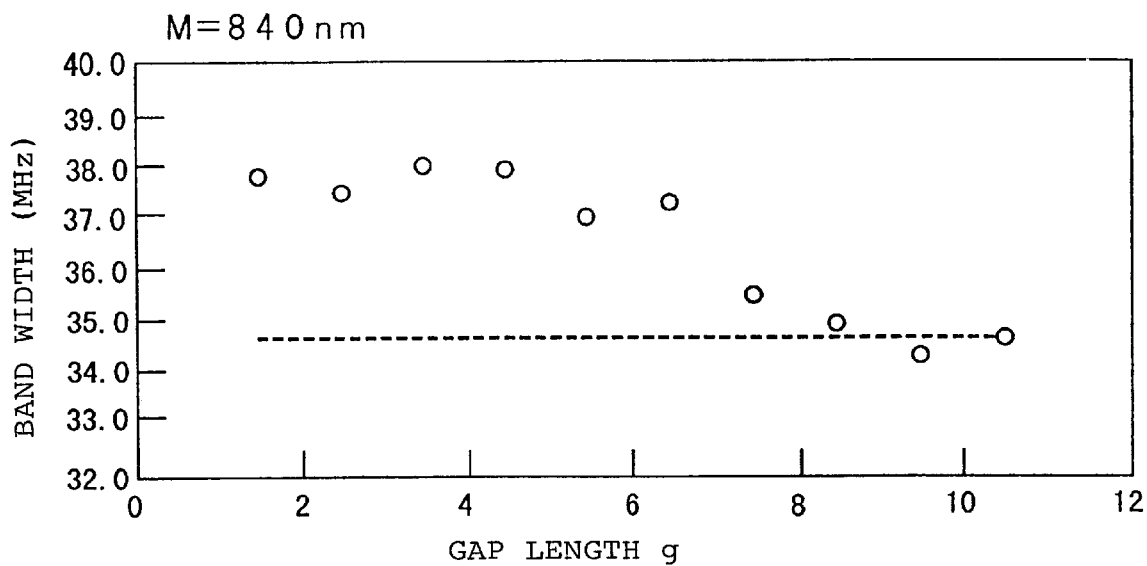
FIG. 5A is a graph showing a relationship between a gap length g and the bandwidth at M=840 nm.
Figure 5B:
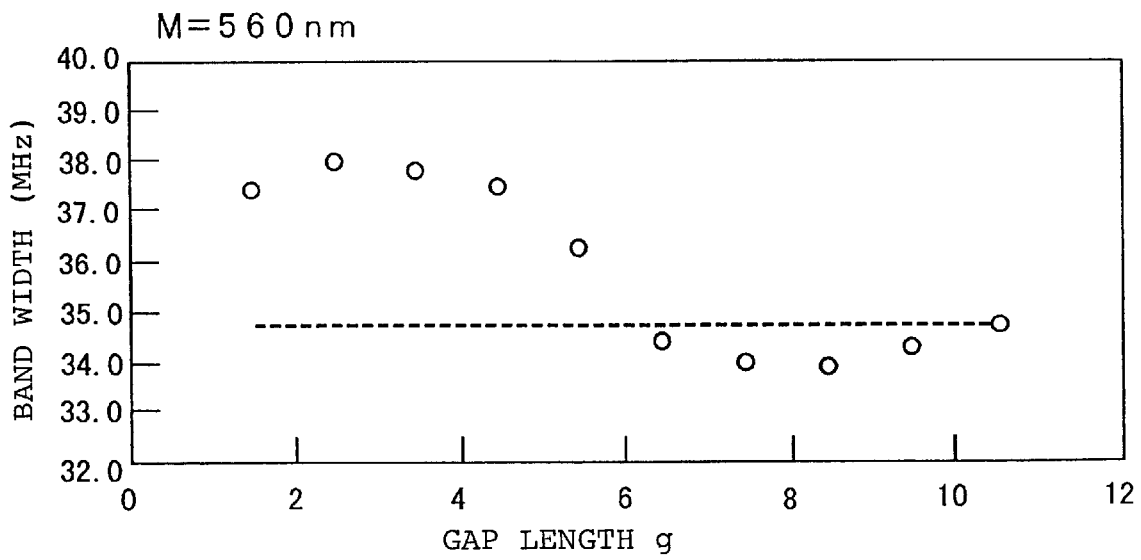
FIG. 5B is a graph showing a relationship between the gap length g and the bandwidth at M=840 nm.
Figure 6:
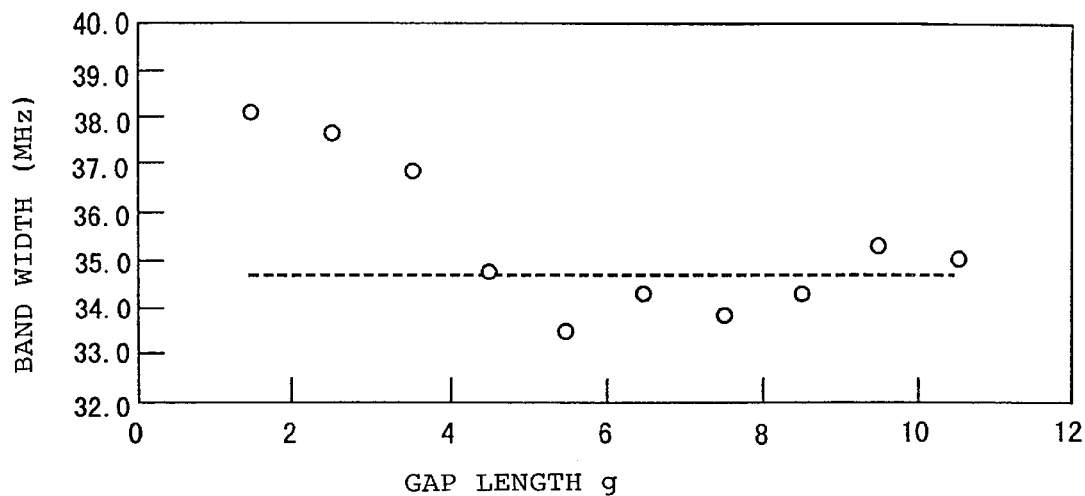
FIG. 6 is a graph showing a relationship between the gap length g and the bandwidth at M=280 nm.

Thus, the bandwidth of the surface acoustic wave device was investigated by changing the gap length g and the film thickness M of each of the electrode films 17 and 18 defining the second layers. FIGS. 5A and 5B, FIG. 6, and the following Table 2 show the results.

FIG. 5A shows the results obtained when the film thickness of each of the electrode films 17 and 18 defining the second layers is about 840 nm (0.188 λ). FIG. 5B shows the results obtained when the film thickness is about 560 nm (0.126 λ). FIG. 6 shows the results obtained when the film thickness is about 280 nm (0.063 λ). As seen in FIGS. 5A, 5B, and 6, the bandwidth tends to be reduced when the gap length g is increased. This tendency becomes remarkable when the film thickness M is small.

For comparison, the bandwidths of the electrodes each having no two-layer structure are shown by the broken lines in FIGS. 5A, 5B, and 6. As seen in FIGS. 5A, 5B, and 6, the bandwidths are reduced to the same level as those of the electrodes each having no two layer structure in the vicinity of the gap length g of about 8 μm at a film thickness M of about 840 nm, in the vicinity of the gap length g of about 6 μm at a film thickness M of about 560 nm, and in the vicinity of the gap length g of about 4.5 μm at a film thickness M of about 280 nm, respectively.

Figure 7:
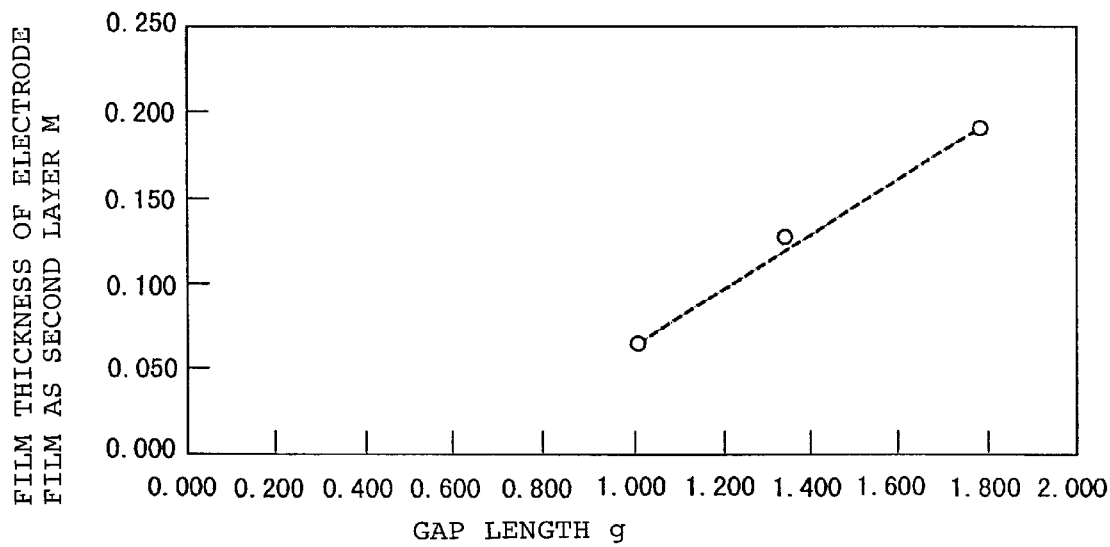
FIG. 7 is a graph showing a relationship between the gap length g and the film thickness M, obtained when energy trapping is effective.

These results are shown by the graph of FIG. 7 obtained by the first-order approximation. The obtained approximation equation is M≧0.159g−0.094.

The values of M and g are expressed by integral multiples of λ.

Thus, a desirable energy trapping effect can be rendered to the surface acoustic wave device by forming the device so as to satisfy the formula of M≧0.159g−0.094. Thus, the bandwidth of the device can be increased.

In the case in which the metal films defining the second layers are made of metal excluding Al, the surface acoustic wave device is constructed so as to satisfy the formula of Ma×(d0/da)≧0.159g−0.084, in which Ma is the metal film thickness of each of the second layers, and do is the density of Al.

Figure 8:
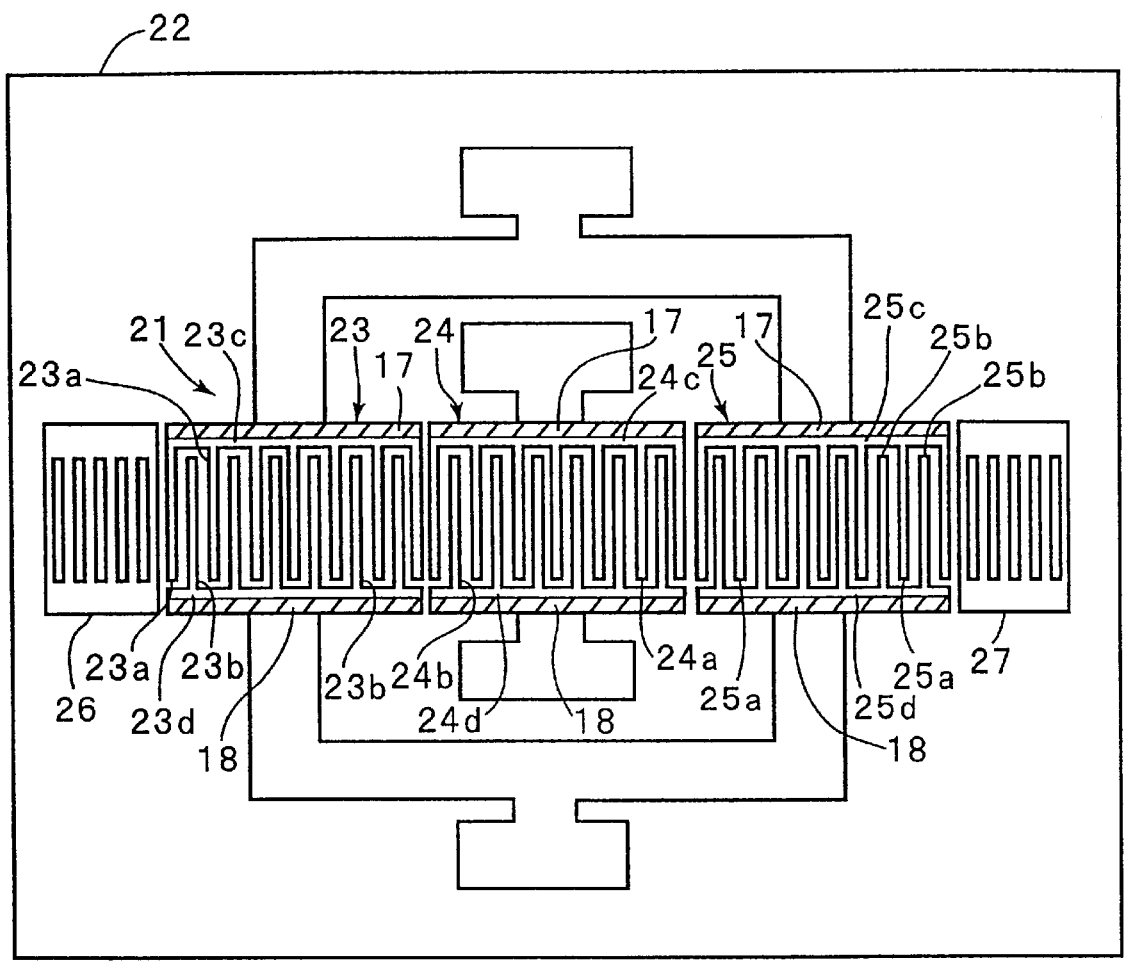
FIG. 8 is a plan view showing the surface acoustic wave resonator according to a second preferred embodiment of the present invention.

FIG. 8 is a schematic plan view showing a one terminal-pair surface acoustic wave resonator for use in a second preferred embodiment of the present invention.

In the second preferred embodiment, a one terminal-pair surface acoustic wave resonator 21 shown in FIG. 8 is preferably used. The surface acoustic wave device 21 of the second preferred embodiment is configured substantially similarly to that of the first preferred embodiment, except that the one terminal-pair surface acoustic wave resonator 21 is used as each of the series arm resonators 3 and the parallel arm resonators 5 to 7. Accordingly, the surface acoustic wave device of the second preferred embodiment is a ladder type filter containing the two series arm resonators and the three parallel arm resonators.

The one terminal-pair surface acoustic wave resonator 21 contains three interdigital transducers 23 to 25 arranged in the surface acoustic wave propagation direction on a piezoelectric substrate 22. In this preferred embodiment, the piezoelectric substrate 22 is also formed of a 36° Y-cut X-directional propagation LiTaO$_3$ substrate.

Grating reflectors 26 and 27 are arranged on both of the sides in the surface acoustic wave propagation direction of the area where the interdigital transducers 23 to 25 are provided.

The electrode finger meshing width in the interdigital transducers 23 to 25 is preferably about 122 μm. The number of the electrode finger pairs of the interdigital transducer 24 arranged in the approximate center of the interdigital transducers 23 to 25 is preferably 18. The number of the electrode finger pairs of each of the interdigital transducers 23 and 25 arranged on both of the sides is preferably 11. The number of the electrode finger pairs of each of the reflectors 26 and 27 is preferably 120. The pitch between the electrode fingers in the interdigital transducers 23 to 25 is about 2.1 $\mu$m. The wavelength of a surface acoustic wave is about 4.2 $\mu$m.

The interdigital transducers 23 to 25 and the reflectors 26 and 27 are made of Al. The film thickness of each of the interdigital transducers 23 to 25 which are the electrode films formed underneath the electrode films defining the second layers described later is about 320 nm. That is, the film thickness of each electrode finger is about 7.4% of the wavelength of the surface acoustic wave. The duty of each of the interdigital transducers 23 to 25 is about 0.72.

The interdigital transducers 23 to 25 include a plurality of electrode fingers 23a, 23b, 24a, 24b, 25a, and 25b, and first and second bus bar electrodes 23c, 23d, 24c, 24d, 25c, and 25d, respectively. Also, in this preferred embodiment, the electrode films 17 and 18 defining the second layers are laminated to the bus bar electrodes 23c, 23d, 24c, 25c, and 25d. The areas where the electrode films 17 and 18 defining the second layers are laminated are hatched for illustration.

The electrode films 17 and 18 defining the second layers are made of Al similarly to those of the first preferred embodiment, and the film thickness thereof is preferably about 840 nm.

Each of the gap lengths g from the boundaries between the bus bar electrodes and the electrode fingers to the edges on the electrode finger sides of the electrode films 17 and 18 defining the second layers is about 2 $\mu$m, that is, about 0.5 $\lambda$.

Figure 9:
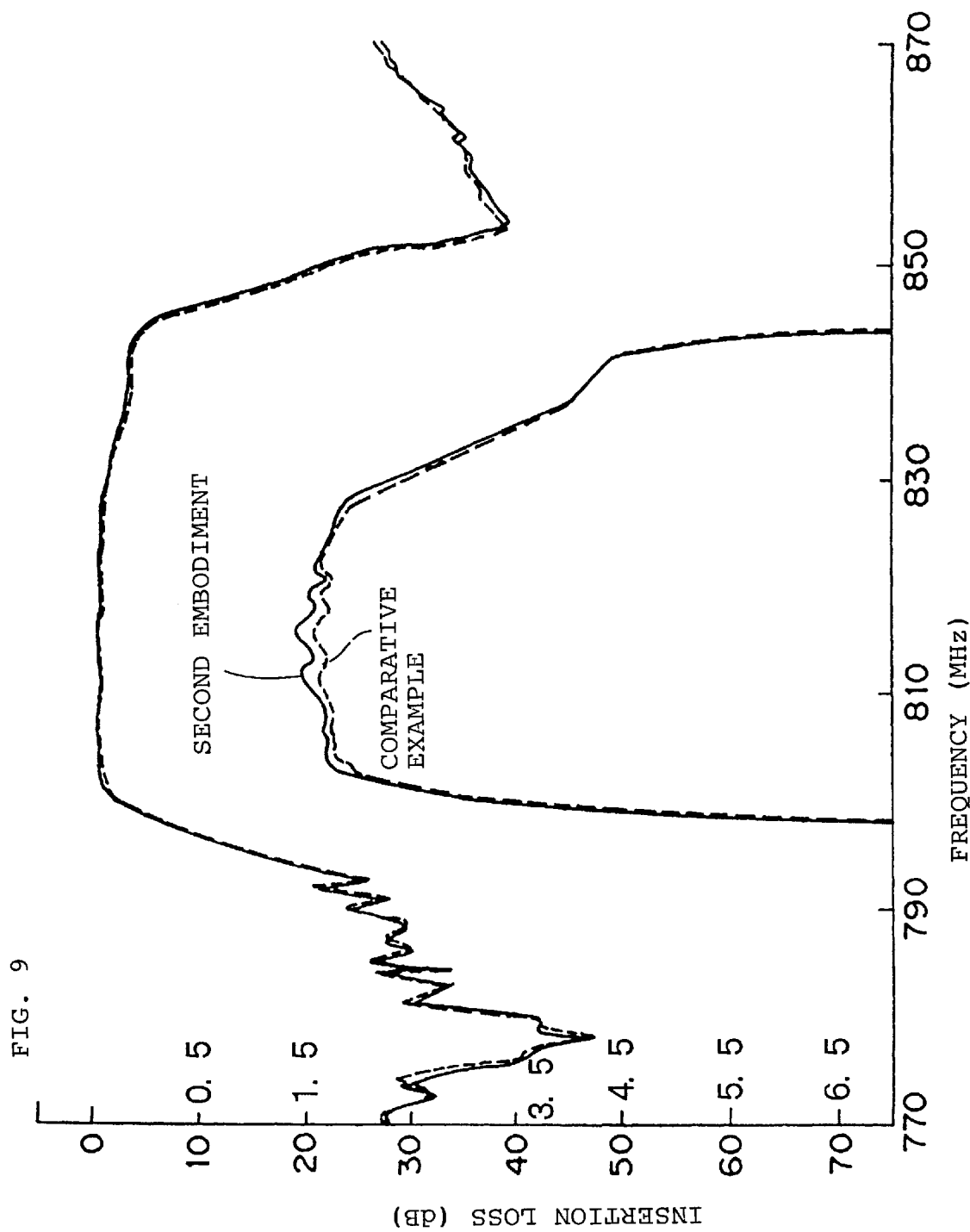
FIG. 9 is a graph showing the filter characteristics of the surface acoustic wave device of the second preferred embodiment and a comparative example thereof.

In FIG. 9, the solid lines represent the filter characteristic of the surface acoustic wave device formed according to this preferred embodiment. For comparison, the broken lines represent the filter characteristic of the surface acoustic wave device configured similarly to the surface acoustic wave device of this preferred embodiment except that no second electrode films are laminated on the bus bar portions. The characteristics shown in the lower part of FIG. 9 are the loss insertions magnified on the scale shown on the right side of the ordinate.

As seen in FIG. 9, the filter characteristic in the bandwidth is significantly improved, although the minimum insertion loss is not changed, by laminating the electrode films defining the second layers according to this preferred embodiment, compared to the surface acoustic wave device having no electrode films defining the second layers.

That is, the film thickness of each electrode finger of the interdigital transducers 23 to 25 is about 7.4% of the wavelength of the surface acoustic wave, and the duty of each of the interdigital transducers 23 to 25 is about 0.72. As described above, the energy of the surface acoustic wave in the Y-axial direction can not be trapped by the electrode films defining the first layers only. However, such a filter characteristic as represented by the broken lines in FIG. 9 can be obtained even when the electrode films defining the first layers only are provided, since the electrode finger meshing width of each interdigital transducer is large, that is, about 30 $\lambda$.

However, the laminated electrode films 17 and 18 defining the second layers cause the filter characteristic to increase considerably, as described above.

In particular, low-loss filter characteristics can be obtained, provided that at least a part of the bus bar electrodes have a thickness larger than that of each electrode finger, namely, Vs/Vm>1 is satisfied, even if the conditions under which the wave mode is substantially present in the Y axial-direction are not satisfied, that is, the film thickness h1 of each electrode finger, the electrode finger width L1, and the length L2 of the gap between adjacent electrode fingers in the surface acoustic wave propagation direction satisfy one of the formulae (1) to (6).

Figure 10:
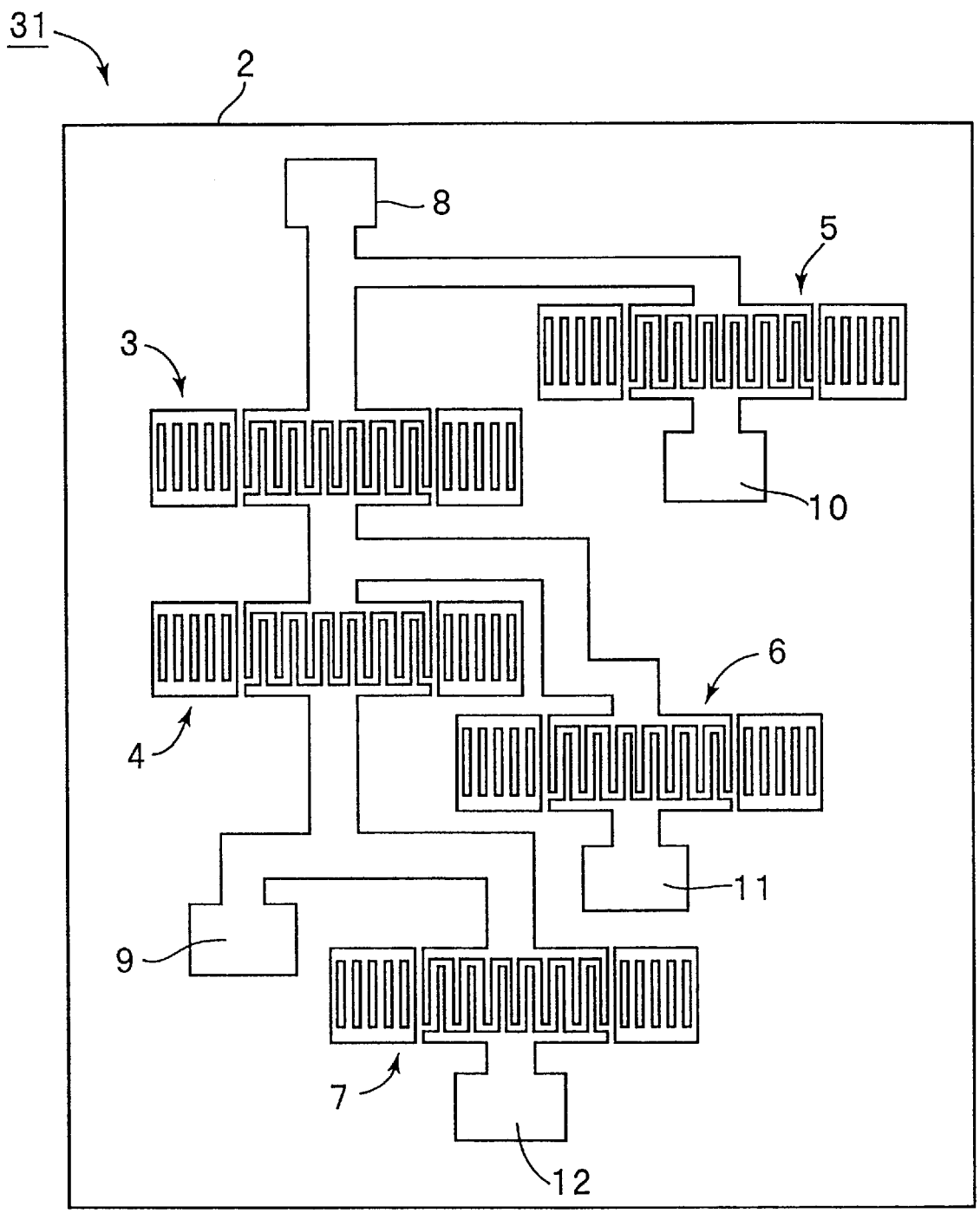
FIG. 10 is a schematic plan view showing the surface acoustic wave device according to a third preferred embodiment of the present invention.

FIG. 10 is a schematic plan view of a surface acoustic wave device according to a third preferred embodiment of the present invention. A surface acoustic wave device 31 of the third preferred embodiment is configured in the same manner as that of the first preferred embodiment. Thus, similar parts are designated by the same reference numerals. The repeated description is omitted by invoking the relevant explanation of the first preferred embodiment.

The present preferred embodiment is different from the first preferred embodiment in that after the electrode arrangement shown in FIG. 10 is formed, an $SiO_2$ film (not shown) is formed so as to have a thickness of approximately 500 nm by sputtering on the overall upper surface of the piezoelectric substrate 2. Thereafter, a resist is applied thereon excluding the series arm resonators 3 and 4, the parallel arm resonators 5 to 7, and the electrode pads 8 to 12. In this state, the $SiO_2$ film on the electrode fingers and the electrode pads is removed by etching. Thus, the reliability of the electrical connection between bonding wires and the electrode pads 8 to 12 can be secured since the $SiO_2$ film on the electrode pads 8 to 12 is removed therefrom.

The surface acoustic wave propagation velocity Vs in the area where the electrode fingers are meshed with each other becomes higher than the acoustic velocity of the surface acoustic wave propagating on the bas bar electrodes having the $SiO_2$ film laminated thereto, since the $SiO_2$ film on the electrode fingers are removed. In other words, the ratio Vs/Vm becomes larger than 1.

Figure 11:
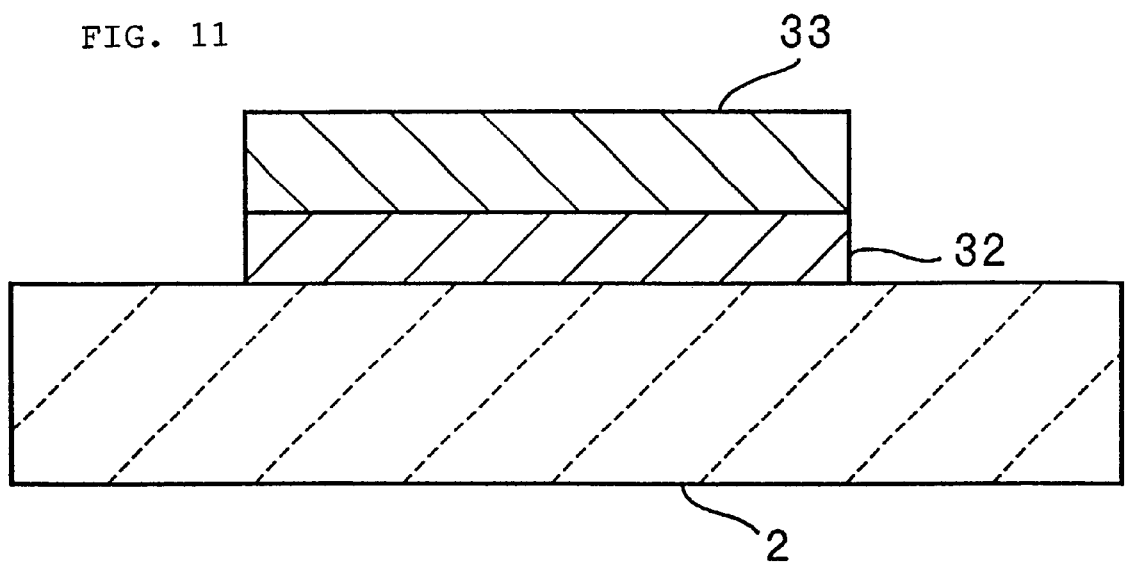
FIG. 11 is a cross sectional view showing the bus bar electrode of the surface acoustic wave device of the third preferred embodiment and an insulating film disposed on the bus bar electrode.

In particular, in this preferred embodiment, the $SiO_2$ film 33 defining an insulating film is laminated to the overall surfaces of the bus bar electrodes 32, as shown in the cross sectional view of FIG. 11. Thus, the bus bar electrodes each have a multi-layer structure. According to the present invention, an insulating film excluding a metal film may be laminated when at least a part of the bus bar electrodes are thicker compared to the electrode fingers. In this case, the same advantages as those of the first preferred embodiment can be also obtained, since the acoustic velocity Vm of the surface acoustic wave propagating on the bus bar electrodes becomes low.

In this preferred embodiment, the $SiO_2$ film 33 preferably defines the insulating film. The thickness of the insulating film is about 500 nm, which is about 11% of the wavelength of the surface acoustic wave. The density of the $SiO_2$ film is about 2.21 g/cm$^3$, and is slightly smaller compared to the density of about 2.69 g/cm$^3$, of the Al film constituting the electrodes, since the $SiO_2$ film is formed by sputtering. On the other hand, the gap length g is small, namely, about 0.1 $\lambda$. Accordingly, the energy trapping effect for the surface acoustic wave in the Y-axial direction is as much as that in the first preferred embodiment.

Figure 12:
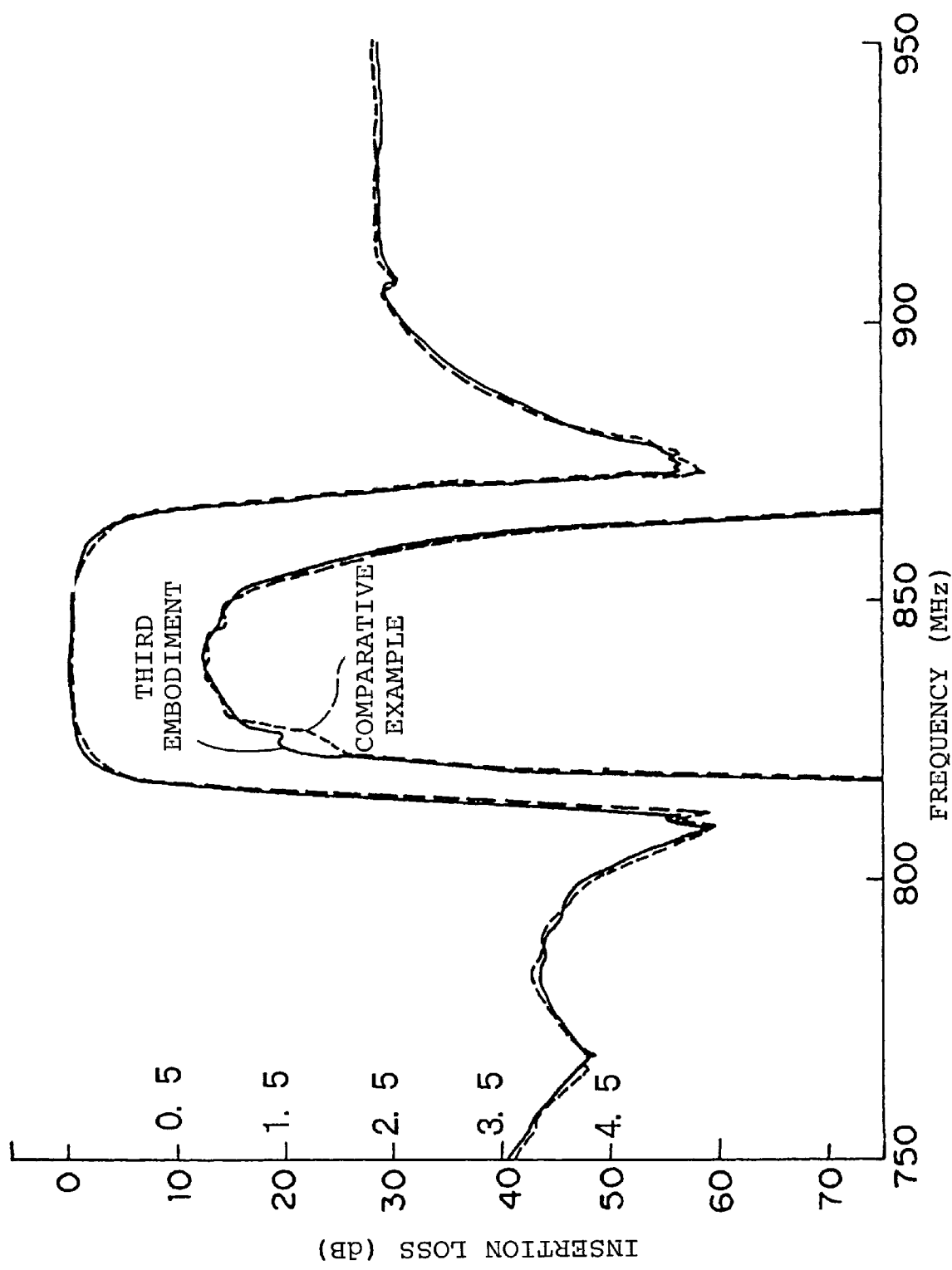
FIG. 12 is a graph showing the filter characteristics of the surface acoustic wave deices of the third preferred embodiment and a comparative example thereof.

In FIG. 12, the solid lines represent the filter characteristic of the surface acoustic wave device of the third preferred embodiment, which is configured as described above. The broken lines represent the filter characteristic of a surface acoustic wave device for comparison configured in the same manner as that of the third preferred embodiment except that no $Sio_2$ film is formed. The filter characteristics in the lower part of FIG. 12 are the insertion losses magnified on the scale shown on the right side of the ordinate.

As seen in FIG. 12, the energy trapping effect is also enhanced, due to the formation of the SiO$_2$ film, in the surface acoustic wave device of the third preferred embodiment. Thus, desirable filter characteristics can be obtained.

In the third preferred embodiment, the insulating film on the electrode fingers is removed, so that the SiO$_2$ film is formed as the insulating film on the bus bar electrodes only. The insulating film may be formed on the electrode fingers, in which the thickness of the insulating film on the electrode fingers is smaller than that on the bus bar electrodes. In this case, the acoustic velocity Vm of the surface acoustic wave propagating on the bus bar electrodes can be controlled to be smaller than the propagation velocity Vs of the surface acoustic wave propagating on the electrode fingers by adjusting the difference in thickness between the insulating films. Thus, the filter characteristic can be improved similarly to that of the third preferred embodiment.

Moreover, a film made of an appropriate insulating material other than the SiO$_2$ film can be used. For film-formation, vapor deposition methods, CVD methods, and so forth can be used.

Furthermore, similarly to the third preferred embodiment, the insulating film may be formed on the bus bar electrodes which is formed on the piezoelectric substrate having the electrode arrangement formed thereon in the same manner as the second preferred embodiment except that the electrode films 17 and 18 defining the second layers are not formed. In this case, the velocity Vm can be controlled to be low similarly to the third preferred embodiment, so that the surface acoustic wave energy can be trapped.

The surface acoustic wave devices each having a ladder circuit configuration are described in the first to third preferred embodiments. According to various preferred embodiments of the present invention, the energy trapping effect for the surface acoustic wave in the Y-axial direction in a one terminal-pair surface acoustic wave resonator is greatly improved, and thereby, the filter characteristic of a filter, which is formed by using the one terminal-pair surface acoustic wave resonator, can be greatly improved, and so forth. Thus, the present invention may be applied not only to surface acoustic wave filters each having a ladder circuit configuration but also various types of surface acoustic wave filters and surface acoustic wave resonators.

Next, an example of an antenna sharing device including the surface acoustic wave filter according to various preferred embodiments of the present invention will be described with reference to FIG. 13.

Figure 13:
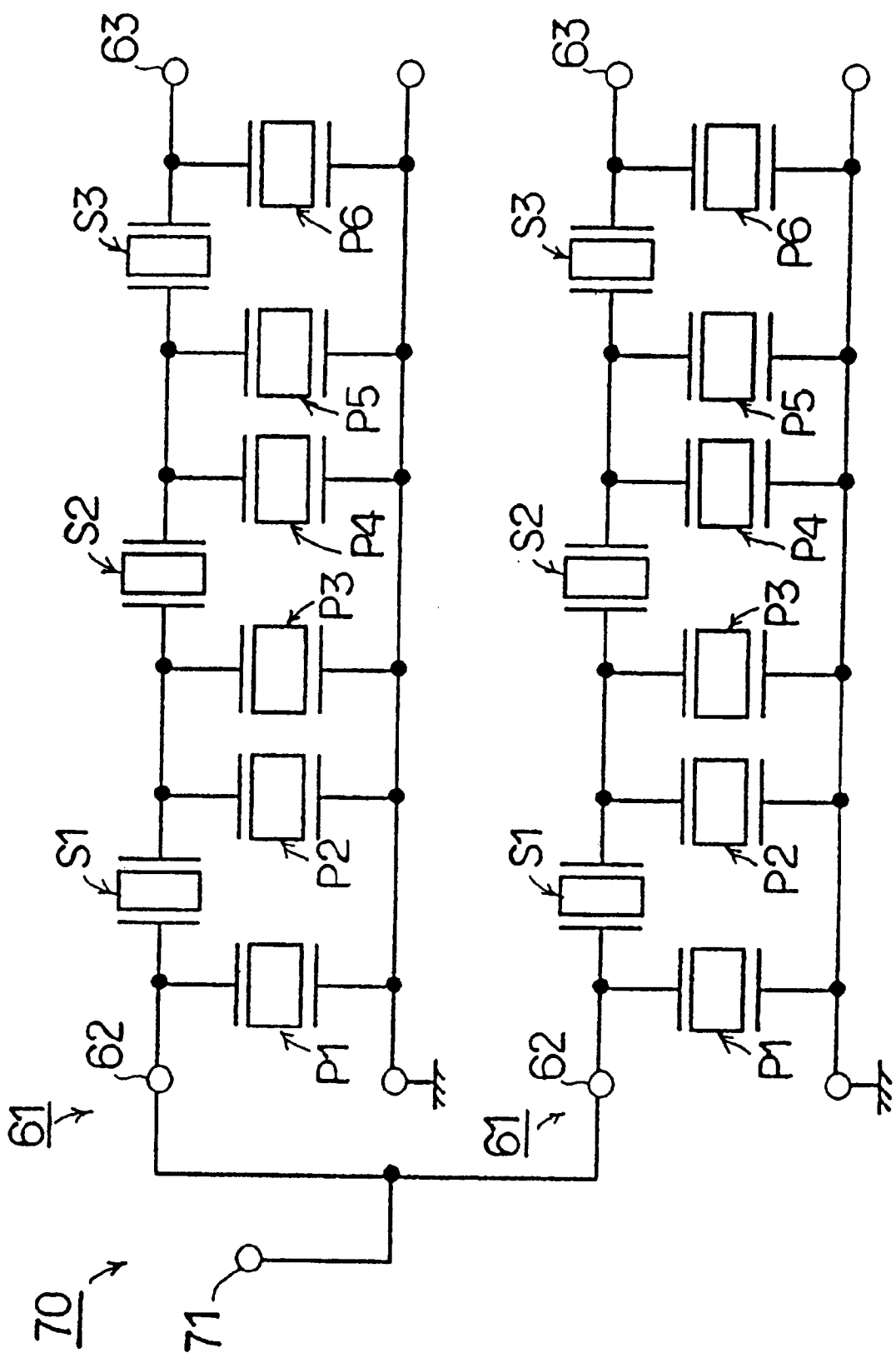
FIG. 13 is a circuit diagram showing a sharing device configured including the surface acoustic wave device of various preferred embodiments of the present invention.

FIG. 13 is a circuit diagram illustrating an antenna sharing device of the present preferred embodiment. An antenna sharing device 70 of this embodiment includes one pair of ladder filters 61 each of which is similar to the ladder surface acoustic wave filter shown in FIG. 3 except that the number of stages is different from that of the filter shown in FIG. 3. In particular, the input terminals 62 of the respective ladder filters 61 are connected to each other to define a first port 71. On the other hand, the output terminals 63 of the respective ladder filters 61 are used as they are to form the second and third ports of the antenna sharing device of this preferred embodiment.

The antenna sharing device can be constructed to include one pair of the ladder filters 61 as described above.

Figure 14:
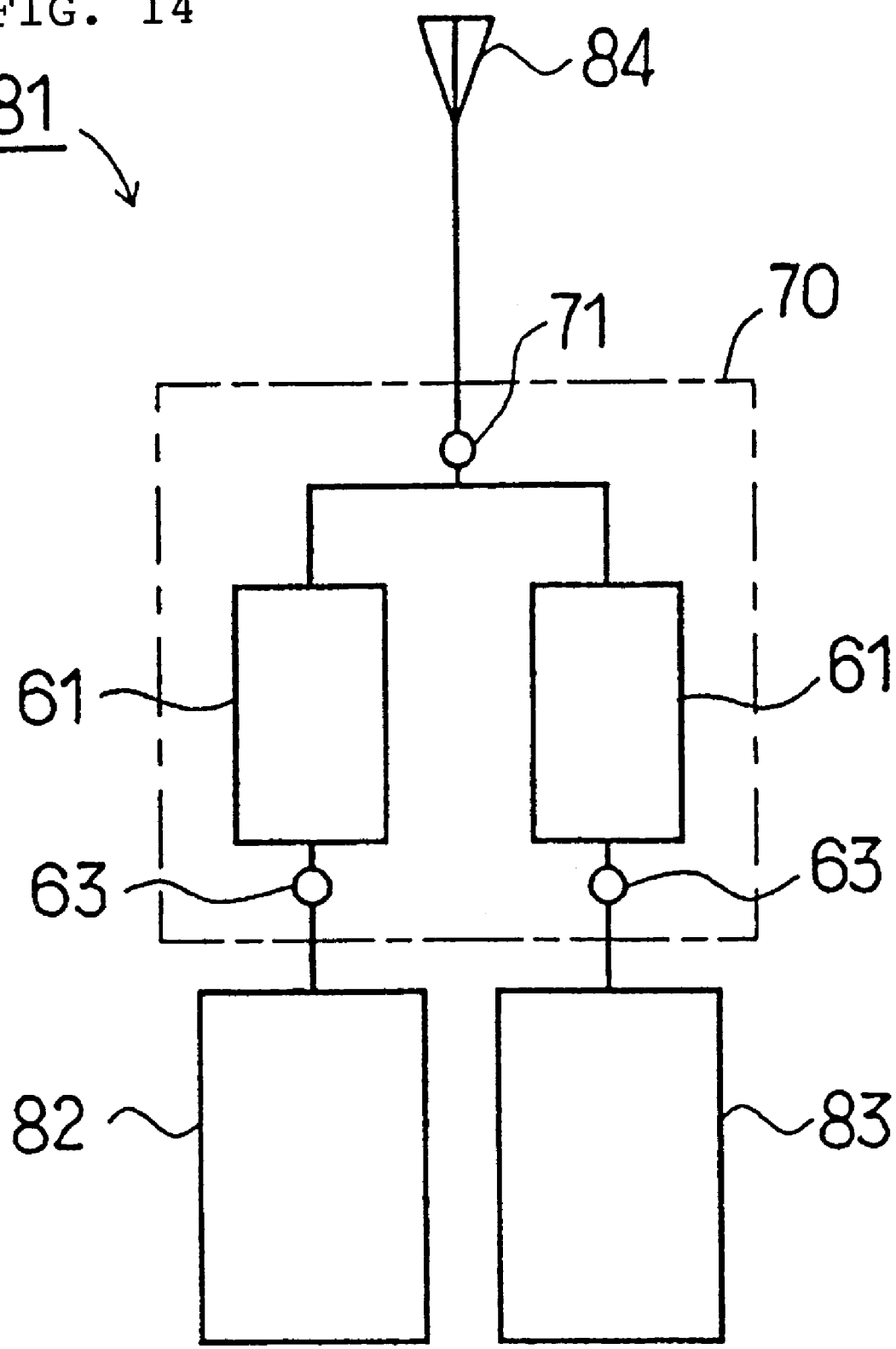
FIG. 14 is a schematic block diagram of a communication system including a sharing device according to various preferred embodiments of the present invention.
Figure 15A:
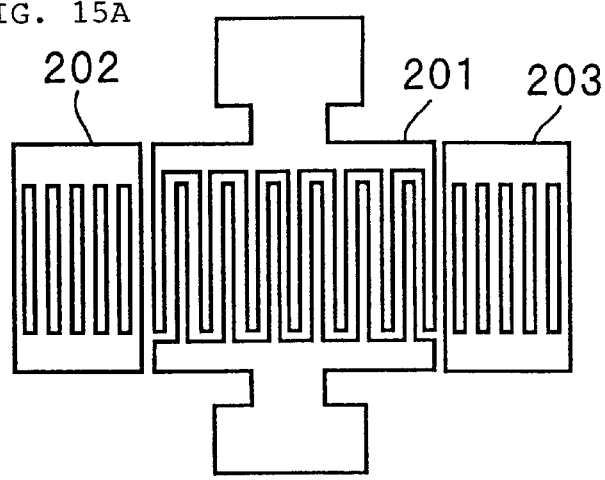
FIG. 15A is a schematic plan view showing a conventional one terminal-pair surface acoustic wave resonator.
Figure 15B:
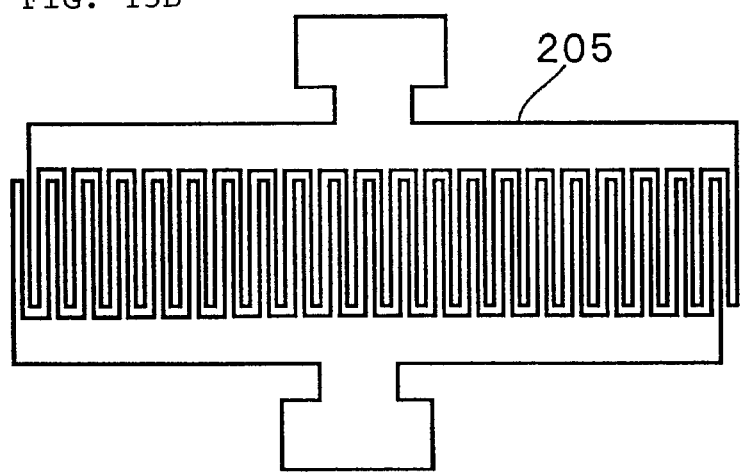
FIG. 15B is a schematic plan view showing another conventional one terminal-pair surface acoustic wave resonator.
Figure 16:
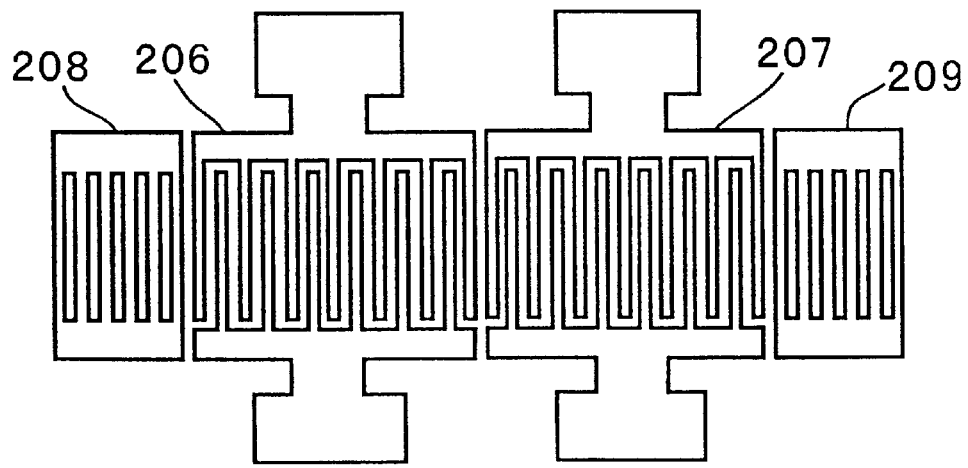
FIG. 16 is a plan view of a conventional resonator type surface acoustic wave filter.
Figure 17:
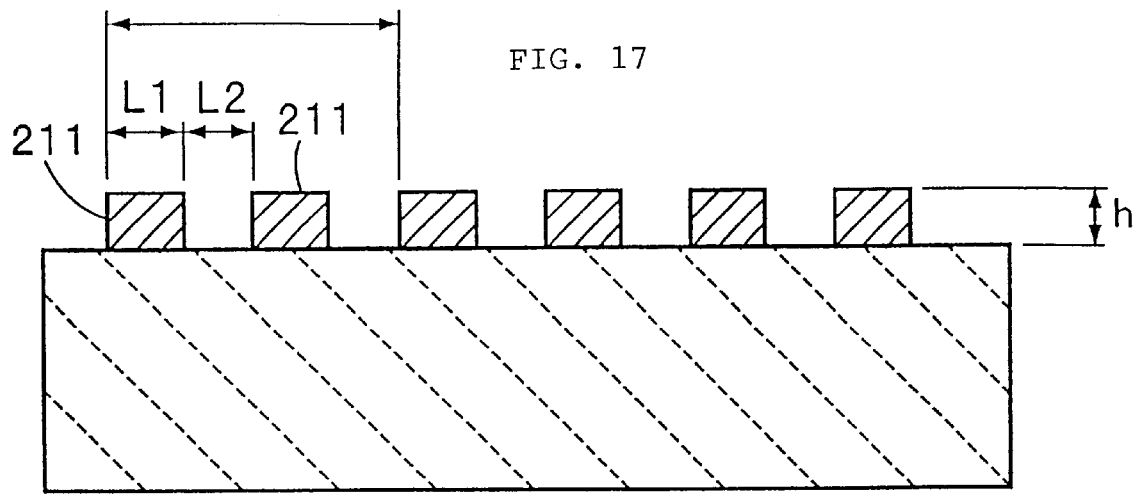
FIG. 17 is a cross sectional view of a main portion of the conventional surface acoustic wave device.
Figure 18:
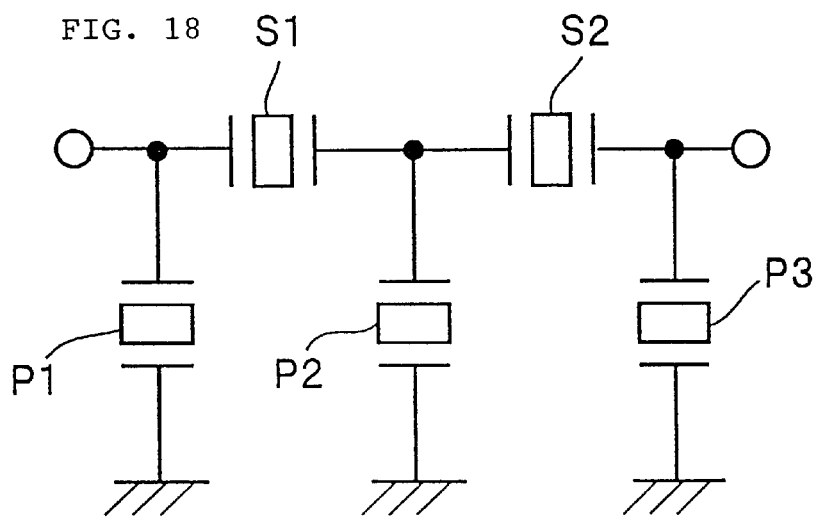
FIG. 18 is a ladder type circuit diagram.
Figure 19:
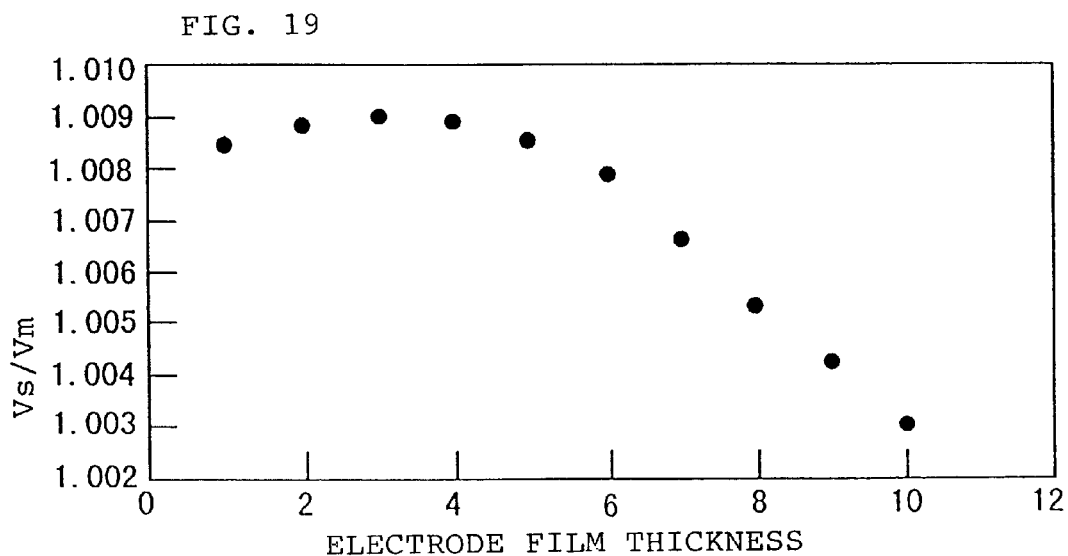
FIG. 19 is a graph showing a relationship between the film thickness of each electrode and Vs/Vm of the conventional surface acoustic wave device.
Figure 20:
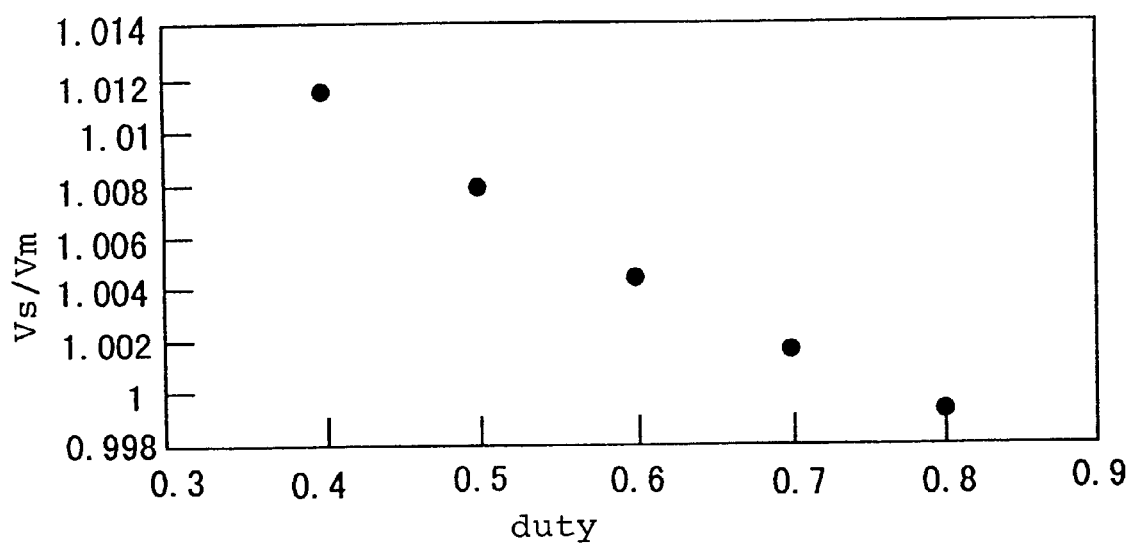
FIG. 20 is a graph showing a relationship between the duty of each electrode and Vs/Vm of the conventional surface acoustic wave device.

Moreover, communications equipment can be formed by using the antenna sharing device described above. FIG. 14 shows an example of such communications equipment.

A communications equipment apparatus 81 of this preferred embodiment preferably includes the antenna sharing device 70 and transmission-reception circuits 82 and 83. The first port 71 of the antenna sharing device 70 is connected to an antenna 84. The output terminals 63 and 63 constituting the second and third ports are connected to the transmission-reception circuits 82 and 83, respectively.

In the antenna sharing device 70, the one pair of the ladder filters 61 are configured so as to have different transmission bands, and thereby, the antenna 84 can be used as transmission and reception antennas.

In the surface acoustic wave according to a preferred embodiment of the present invention, the film thickness of each electrode finger of the interdigital electrode is not less than about 0.04 λ. Even if the device is in the condition that the energy trapping effect tends to be reduced, the energy trapping effect can be greatly improved, since at least a portion of the first and second bus bar electrodes having a thickness larger than that of each electrode finger, so that the acoustic velocity Vm of a surface acoustic wave propagating on the bus bar electrodes becomes low compared to the sound velocity Vs of the surface acoustic wave propagating on the electrode fingers. Thus, the surface acoustic wave device, if it is used in a surface acoustic wave filter having a ladder circuit configuration, provides a low loss filter characteristic.

In the surface acoustic wave according to another preferred embodiment of the present invention, the ratio of L1(L1+L2) is satisfied, that is, the duty is not less than about 0.5. Even if the device is in the condition that the energy trapping effect tends to be reduced, the energy trapping effect is greatly improved, since at least a portion of the first and second bus bar electrodes having a thickness larger than that of each electrode finger, so that the acoustic velocity Vm of a surface acoustic wave propagating on each bus bar electrode becomes low compared to the sound velocity Vs of the surface acoustic wave propagating on the electrode fingers. Thus, the surface acoustic wave device, if it is used in a surface acoustic wave filter having a ladder circuit configuration, has a low loss filter characteristic.

According to another preferred embodiment of the present invention, one of the above-described formulae (1) to (6) is satisfied, and substantially, the conditions under which no wave mode in the Y-axial direction is present are not satisfied substantially. However, in this case, the acoustic velocity Vm of a surface acoustic wave propagating on each bus bar electrode becomes low compared to the sound velocity Vs of the surface acoustic wave propagating on the electrode fingers, since at least a portion of the first and second bus bar electrodes having a thickness larger than that of the electrode fingers. Accordingly, the Vs/Vm>1 is satisfied, so that the energy trapping in the Y-axial direction can be performed. Thus, if the device is used in a filter, a low loss filter characteristic can be obtained.

According to preferred embodiments of the present invention, at least a portion of the bus bar electrode has a thickness larger than that of each electrode finger. Various methods can be used to increase the film thickness of each bus bar electrode. This can be realized by forming at least a portion of the bus bar electrodes so as to have a multi-layer structure including a plurality of films laminated together.

In the case in which at least a portion of each bus bar electrode has a multi-layer structure, the multi-layer structure may be formed by laminating at least one electrode film on the electrode film, or the multi-layer structure may be formed by laminating an insulating film onto the electrode film. In the case in which the plurality of electrode films are laminated to obtain the multi-layer structure, the electrode film defining the lowest layer is formed so as to be connected to the electrode fingers. In the case in which the second layer and the proceeding layers are made of a metal different from that of the electrode film defining the lowest layer, the electrode film defining the lowest layer can be formed by the same process for forming the electrode fingers. Moreover, since the second layer and the proceeding layers are made of the metal different from that of the electrode film defining the lowest layer, the type of the metal can be selected so that a high energy trapping effect can be obtained.

In the case in which at least one layer of the second layer and the proceeding layers is made of a metal having a relatively high density, compared to the electrode film defining the lowest layer, a large mass-addition effect can be obtained, and thereby, the acoustic velocity of the surface acoustic wave propagating on the bus bar electrodes can be more reduced. For example, when the first layer is made of Al or an Al containing alloy, a large energy trapping effect for the surface acoustic wave can be obtained by forming at least one layer of the second and the proceeding layers by use of a metal having a relatively high density, such as Au, Ag, W, Ti, Ni, or other suitable material.

Moreover, in the case in which at least one layer of the electrode films defining the second and the proceeding layers has a lower resistivity and a larger thickness compared to the electrode film defining the lowest layer, the acoustic velocity of a surface acoustic wave propagating on the bus bar electrode can be effectively controlled to be low. Thus, the surface acoustic wave energy trapping effect can be greatly improved. For example, the energy trapping effect can be improved by forming at least one layer of the second layer and the proceeding layers by use of Au, Ag, Cu, or other suitable material, as described above.

In each bus bar electrode having a multi-layer structure, an insulating film may be formed between electrode films constituting the multi-layer structure so as to secure electrical connection between the upper and lower electrode films. In this case, the acoustic velocity of the surface acoustic wave propagating on the bus bar electrode can be controlled to be low, due to the mass addition effect of the insulation film. Thus, a desirable energy trapping effect can be obtained.

In the surface acoustic wave device according to various preferred embodiments of the present invention, the surface acoustic wave energy trapping effect can be greatly improved, and the bandwidth can be increased when $M \geq 0.159g - 0.094$ or $Max(d0/da) \geq 0.159g - 0.094$ is satisfied.

In the surface acoustic wave device according to another preferred embodiment of the present invention, the film thickness of the electrode fingers in the interdigital transducer is preferably not less than about $0.04 \lambda$. Under this condition, the surface acoustic wave energy trapping in the Y-axial direction can not satisfactorily be performed. However, since the insulating film is formed on the bus bar electrode, the propagation velocity Vm of the surface acoustic wave propagating on the bus bar electrode becomes low, due to the mass addition effect of the insulating film. Thus, a sufficient surface acoustic wave energy trapping effect can be obtained. Thus, the surface acoustic wave device, when it is used for a surface acoustic wave filter, can provide a low loss filter characteristic.

Similarly, in the surface acoustic wave device according to another preferred embodiment of the present invention, the duty is not less than about 0.5. Since the insulating film is formed on the bus bar electrode, the acoustic velocity of the surface acoustic wave propagating on each bus bar electrode can be controlled to be low, even if the surface acoustic wave device is under the condition that the surface acoustic wave energy trapping effect in the Y-axial direction can not sufficiently be performed. Thus, Vs/Vm>1 is satisfied. Accordingly, the surface acoustic wave energy tapping in the Y-axial direction can be performed similarly to the surface acoustic wave device according to the fourth preferred embodiment of the present invention. When the surface acoustic wave device is used to define a filter, for example, a low loss filter characteristic can be obtained.

In the surface acoustic wave device according to another preferred embodiment of the present invention, one of the above-described formulae (1) to (6) is satisfied. The condition under which a wave mode in the Y-axial direction is present is not substantially satisfied. Also, in this case, an insulating film is formed on the bus bar electrode according to various preferred embodiments of the present invention. Thus, the acoustic velocity of the surface acoustic wave propagating on the bus bar electrode is reduced. Thus, Vs/Vm>1 is satisfied. Accordingly, the surface acoustic wave energy trapping in the Y-axial direction can be performed similarly to the surface acoustic wave device according to fourth or fifth preferred embodiments of the present invention. When the surface acoustic wave device is used to define a filter, for example, a low loss filter characteristic can be obtained.

In the surface acoustic wave device according to various preferred embodiments of the present invention, insulating films are disposed on the electrode fingers and the bus bar electrodes. In the case in which the thickness of the insulating film provided on each bus bar electrode is larger than that of the insulating film formed on each bus bar electrode, the acoustic velocity Vm of the surface acoustic wave propagating on the bus bar electrode becomes low. Thus, the ratio Vs/Vm>1 is satisfied. The surface acoustic wave in the Y-axial direction can be effectively trapped. When the surface acoustic wave device is used to define a filter, for example, a low loss filter characteristic can be obtained.

In the antenna sharing device including one of the surface acoustic wave devices according to various preferred embodiments of the present invention, the loss in the antenna sharing device is minimized, since the surface acoustic wave loss is low.

Moreover, in the communication equipment including the antenna sharing device of preferred embodiments of the present invention, the overall loss in the communication equipment is minimized, since the equipment includes the antenna sharing device having a low loss as described above.

What is claimed is:

1. A surface acoustic wave device comprising:
   a piezoelectric substrate at which a surface acoustic wave having an anisotropy index γ in the propagation direction of less than about −1 is excited; and
   at least one interdigital transducer disposed on the piezoelectric substrate and including first and second bus bar electrodes and a plurality of electrode fingers, the plurality of electrode fingers being connected to the first and second bus bar electrodes so as to define a pair of comb-shaped electrodes that are interdigitated with each other, the plurality of electrode fingers containing Al as a major component;
   wherein each of the electrode fingers has a film thickness of not less than about $0.04 \lambda$, where $\lambda$ is the wavelength of the surface acoustic wave, and
   at least a portion of the first and second bus bar electrodes has a thickness larger than that of each of the electrode fingers so that the energy of the surface acoustic wave is trapped substantially perpendicularly to the propagation direction of the surface acoustic wave.

2. A surface acoustic wave device according to claim 1, wherein at least a portion of the first and second bus bar electrodes have a multi-layer structure in which a plurality of electrode films are laminated to each other, whereby at least a portion of the first and second bus bar electrodes have a thickness larger than that of each of the electrode fingers.

3. A surface acoustic wave device according to claim 2, wherein the electrode film defining the lowest layer in each of the bus bar electrodes having a multi-layer structure is arranged so as to be connected to the electrode fingers, and the electrode films defining the second and succeeding layers are made of a metal that is different from that used to form the electrode film defining the lowest layer.

4. A surface acoustic wave device according to claim 3, wherein, in each of the bus bar electrodes having a multi-layer structure, at least one layer of the electrode films defining the second and succeeding layers is made of a metal having a relatively high density compared to the electrode film defining the lowest layer.

5. A surface acoustic wave device according to claim 3, wherein, in each of the bus bar electrodes having a multi-layer structure, at least one layer of the electrode films defining the second and the succeeding layers has a lower resistivity and a larger thickness compared to the electrode film defining the lowest layer.

6. A surface acoustic wave device according to claim 3, wherein, in each of the bus bar electrodes having a multi-layer structure, an insulating film is disposed between electrode films constituting the multi-layer structure so as to secure electrical connection between the upper and lower electrode films.

7. A surface acoustic wave device according to claim 3, wherein, in each of the bus bar electrodes having a multi-layer structure, a distance g of the boundary between the bus bar electrode and the electrode fingers in the electrode film of the lowest layer to the edge on the electrode finger side of the electrode film made of Al defining the second layer, and the film thickness M of the electrode film defining the second layer are in the range defined by the formula of $M \geq 0.159g - 0.094$, in which values of g and M are integral multiples of the wavelength $\lambda$ of the surface acoustic wave.

8. A surface acoustic wave device according to claim 3, wherein, in each of the bus bar electrodes having a multi-layer structure, the electrode film thickness Ma of the second layer is in the range defined by the formula of $Ma \times (d0/da) \geq 0.159g - 0.094$, in which g is the distance of the boundary between the bus bar electrode and the electrode fingers in the electrode film of the lowest layer to the edge on the electrode finger side of the electrode film made of Al defining the second layer the values of g and M are expressed by integral multiples of the wavelength $\lambda$ of the surface acoustic wave, respectively, the second layer is made of metal excluding Al, da is the density of the metal of the second layer, and d0 is the density of Al.

9. A surface acoustic wave device according to claim 1, wherein the piezoelectric substrate at which a surface acoustic wave is a $LiTaO_3$ substrate at which a pseudo surface acoustic wave is excited.

10. A surface acoustic wave device comprising:
a piezoelectric substrate at which a surface acoustic wave having an anisotropy index $\gamma$ in the propagation direction of less than about $-1$ is excited; and
at least one interdigital transducer disposed on the piezoelectric substrate and including first and second bus bar electrodes and a plurality of electrode fingers, the plurality of electrode fingers being connected to the first and second bus bar electrodes so as to define a pair of comb-shaped electrodes that are interdigitated with each other, the plurality of electrode fingers containing Al as a major component;
wherein an electrode finger width L1 of the interdigital transducer and a gap length L2 between adjacent electrode fingers in the surface acoustic wave propagation direction satisfy the formula of $L1(L1+L2) \geq 0.5$, and
at least a portion of the first and second bus bar electrodes has a thickness larger than that of each of the electrode fingers so that the energy of the surface acoustic wave is trapped substantially perpendicularly to the propagation direction of the surface acoustic wave.

11. A surface acoustic wave device according to claim 10, wherein at least a portion of the first and second bus bar electrodes have a multi-layer structure in which a plurality of electrode films are laminated to each other, whereby at least a portion of the first and second bus bar electrodes have a thickness larger than that of each of the electrode fingers.

12. A surface acoustic wave device according to claim 11, wherein the electrode film defining the lowest layer in each of the bus bar electrodes having a multi-layer structure is arranged so as to be connected to the electrode fingers, and the electrode films defining the second and succeeding layers are made of a metal that is different from that used to form the electrode film defining the lowest layer.

13. A surface acoustic wave device according to claim 12, wherein, in each of the bus bar electrodes having a multi-layer structure, at least one layer of the electrode films defining the second and succeeding layers is made of a metal having a relatively high density compared to the electrode film defining the lowest layer.

14. A surface acoustic wave device according to claim 12, wherein, in each of the bus bar electrodes having a multi-layer structure, at least one layer of the electrode films defining the second and the succeeding layers has a lower resistivity and a larger thickness compared to the electrode film defining the lowest layer.

15. A surface acoustic wave device according to claim 12, wherein, in each of the bus bar electrodes having a multi-layer structure, an insulating film is disposed between electrode films constituting the multi-layer structure so as to secure electrical connection between the upper and lower electrode films.

16. A surface acoustic wave device according to claim 12, wherein, in each of the bus bar electrodes having a multi-layer structure, a distance g of the boundary between the bus bar electrode and the electrode fingers in the electrode film of the lowest layer to the edge on the electrode finger side of the electrode film made of Al defining the second layer, and the film thickness M of the electrode film defining the second layer are in the range defined by the formula of $M \geq 0.159g - 0.094$, in which values of g and M are integral multiples of the wavelength $\lambda$ of the surface acoustic wave.

17. A surface acoustic wave device according to claim 12, wherein, in each of the bus bar electrodes having a multi-layer structure, the electrode film thickness Ma of the second layer is in the range defined by the formula of $Ma \times (d0/da) \geq 0.159g - 0.094$, in which g is the distance of the boundary between the bus bar electrode and the electrode fingers in the electrode film of the lowest layer to the edge on the electrode finger side of the electrode film made of Al defining the second layer the values of g and M are expressed by integral multiples of the wavelength $\lambda$ of the surface acoustic wave, respectively, the second layer is made of metal excluding Al, da is the density of the metal of the second layer, and d0 is the density of Al.

18. A surface acoustic wave device according to claim 10, wherein the piezoelectric substrate at which a surface acoustic wave is a LiTaO$_3$ substrate at which a pseudo surface acoustic wave is excited.

19. A surface acoustic wave device comprising:
   a piezoelectric substrate at which a surface acoustic wave having an anisotropy index γ in the propagation direction of less than about −1 is excited; and
   at least one interdigital transducer disposed on the piezoelectric substrate and including first and second bus bar electrodes and a plurality of electrode fingers, the plurality of electrode fingers being connected to the first and second bus bar electrodes so as to define a pair of comb-shaped electrodes that are interdigitated with each other, the plurality of electrode fingers containing Al as a major component;
   wherein a film thickness h1 of each of the electrode fingers, a electrode finger width L1, a gap length L2 between adjacent electrode fingers in the surface acoustic wave direction, a wavelength λ of the surface acoustic wave satisfy one of the following formulae (1) to (6);

$L1(L1+L2) \geq 0.55$ and $h/\lambda \geq 0.100$     (1)

$L1(L1+L2) \geq 0.60$ and $h/\lambda \geq 0.090$     (2)

$L1(L1+L2) \geq 0.65$ and $h/\lambda \geq 0.080$     (3)

$L1(L1+L2) \geq 0.70$ and $h/\lambda \geq 0.070$     (4)

$L1(L1+L2) \geq 0.75$ and $h/\lambda \geq 0.065$     (5)

$L1(L1+L2) \geq 0.80$ and $h/\lambda \geq 0.055$     (6)

and
   at least a portion of the first and second bus bar electrodes having a thickness larger than that of each of the electrode fingers so that the energy of the surface acoustic wave is trapped substantially perpendicularly to the propagation direction of the surface acoustic wave.

20. A surface acoustic wave device according to claim 19, wherein at least a portion of the first and second bus bar electrodes have a multi-layer structure in which a plurality of electrode films are laminated to each other, whereby at least a portion of the first and second bus bar electrodes have a thickness larger than that of each of the electrode fingers.

21. A surface acoustic wave device according to claim 20, wherein the electrode film defining the lowest layer in each of the bus bar electrodes having a multi-layer structure is arranged so as to be connected to the electrode fingers, and the electrode films defining the second and succeeding layers are made of a metal that is different from that used to form the electrode film defining the lowest layer.

22. A surface acoustic wave device according to claim 21, wherein, in each of the bus bar electrodes having a multi-layer structure, at least one layer of the electrode films defining the second and succeeding layers is made of a metal having a relatively high density compared to the electrode film defining the lowest layer.

23. A surface acoustic wave device according to claim 21, wherein, in each of the bus bar electrodes having a multi-layer structure, at least one layer of the electrode films defining the second and the succeeding layers has a lower resistivity and a larger thickness compared to the electrode film defining the lowest layer.

24. A surface acoustic wave device according to claim 21, wherein, in each of the bus bar electrodes having a multi-layer structure, an insulating film is disposed between electrode films constituting the multi-layer structure so as to secure electrical connection between the upper and lower electrode films.

25. A surface acoustic wave device according to claim 21, wherein, in each of the bus bar electrodes having a multi-layer structure, a distance g of the boundary between the bus bar electrode and the electrode fingers in the electrode film of the lowest layer to the edge on the electrode finger side of the electrode film made of Al defining the second layer, and the film thickness M of the electrode film defining the second layer are in the range defined by the formula of $M \geq 0.159g - 0.094$, in which values of g and M are integral multiples of the wavelength λ of the surface acoustic wave.

26. A surface acoustic wave device according to claim 21, wherein, in each of the bus bar electrodes having a multi-layer structure, the electrode film thickness Ma of the second layer is in the range defined by the formula of $Ma \times (d0/da) \geq 0.159g - 0.094$, in which g is the distance of the boundary between the bus bar electrode and the electrode fingers in the electrode film of the lowest layer to the edge on the electrode finger side of the electrode film made of Al defining the second layer the values of g and M are expressed by integral multiples of the wavelength λ of the surface acoustic wave, respectively, the second layer is made of metal excluding Al, da is the density of the metal of the second layer, and d0 is the density of Al.

27. A surface acoustic wave device according to claim 19, wherein the piezoelectric substrate at which a surface acoustic wave is a LiTaO$_3$ substrate at which a pseudo surface acoustic wave is excited.

28. A surface acoustic wave device comprising:
   a piezoelectric substrate at which a surface acoustic wave is excited, having an anisotropy index γ in the propagation direction of less than about −1; and
   at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave;
   the film thickness of each of the electrode fingers in the interdigital transducer being not less than about 0.04 λ, in which λ is the wavelength of the surface acoustic wave;
   an insulating film being formed on each of the bus bar electrodes so that the thickness of the bus bar electrodes is larger than that of each electrode fingers.

29. A surface acoustic wave device according to claim 28, further comprising an insulating film disposed on the electrode fingers, said insulating film having a thickness larger than that of the insulating film disposed on each of the electrode fingers.

30. A surface acoustic wave device according to claim 28, wherein the piezoelectric substrate at which a surface acoustic wave is a LiTaO$_3$ substrate at which a pseudo surface acoustic wave is excited.

31. A surface acoustic wave device comprising:
   a piezoelectric substrate at which a surface acoustic wave is excited, having an anisotropy index γ in the propagation direction of less than about −1; and
   at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave;

the electrode finger width L1 and the gap length L2 between adjacent electrode fingers in the surface acoustic wave propagation direction satisfying the formula of L1(L1+L2)≧0.5;

an insulating film being disposed on each of the bus bar electrodes so that the thickness of the bus bar electrodes is larger than that of each of the electrode fingers.

32. A surface acoustic wave device according to claim 31, further comprising an insulating film disposed on the electrode fingers, said insulating film having a thickness larger than that of the insulating film disposed on each of the electrode fingers.

33. A surface acoustic wave device according to claim 31, wherein the piezoelectric substrate at which a surface acoustic wave is a LiTaO$_3$ substrate at which a pseudo surface acoustic wave is excited.

34. A surface acoustic wave device comprising:

a piezoelectric substrate at which a surface acoustic wave is excited, having an anisotropy index γ in the propagation direction of less than about −1; and at least one interdigital transducer disposed on the piezoelectric substrate, having a plurality of electrode fingers each containing Al as a major component and first and second bus bar electrodes, in which the energy of the surface acoustic wave is trapped substantially perpendicularly to the propagation direction of the surface acoustic wave;

the film thickness h1 of each of the electrode fingers, the electrode finger width L1, the gap length L2 between adjacent electrode fingers in the surface acoustic wave direction, the wavelength λ of the surface acoustic wave satisfying one of the following formulae (1) to (6);

$$L1(L1+L2) \geq 0.55 \text{ and } h/\lambda \geq 0.100 \tag{1}$$

$$L1(L1+L2) \geq 0.60 \text{ and } h/\lambda \geq 0.090 \tag{2}$$

$$L1(L1+L2) \geq 0.65 \text{ and } h/\lambda \geq 0.080 \tag{3}$$

$$L1(L1+L2) \geq 0.70 \text{ and } h/\lambda \geq 0.070 \tag{4}$$

$$L1(L1+L2) \geq 0.75 \text{ and } h/\lambda \geq 0.065 \tag{5}$$

$$L1(L1+L2) \geq 0.80 \text{ and } h/\lambda \geq 0.055 \tag{6}$$

and further includes an insulating film disposed on the bus bar electrodes.

35. A surface acoustic wave device according to claim 34, further comprising an insulating film disposed on the electrode fingers, said insulating film having a thickness larger than that of the insulating film disposed on each of the electrode fingers.

36. A surface acoustic wave device according to claim 34, wherein the piezoelectric substrate at which a surface acoustic wave is a LiTaO$_3$ substrate at which a pseudo surface acoustic wave is excited.

37. An antenna sharing device includes at least one of the surface acoustic wave device according to claim 1.

38. A communications equipment apparatus including the antenna sharing device of claim 16.

* * * * *

UNITED STATES PATENT AND TRADEMARK OFFICE
CERTIFICATE OF CORRECTION

PATENT NO. : 6,404,101 B1
DATED : June 11, 2002
INVENTOR(S) : Norio Taniguchi et al.

It is certified that error appears in the above-identified patent and that said Letters Patent is hereby corrected as shown below:

Column 5,
Lines 20-29, "L1(L1 + L2)" should read -- L1/(L1+ L2) --.

Column 7,
Lines 14-23, "L1(L1 + L2)" should read -- L1/(L1+ L2) --.

Column 18,
Line 27, "L1(L1 + L2)" should read -- L1/(L1+ L2) --.

Column 22,
Line 10, "L1(L1 + L2)" should read -- L1/(L1+ L2) --.

Column 23,
Lines 26-34, "L1(L1 + L2)" should read -- L1/(L1+ L2) --.

Column 25,
Line 9, "L1(L1 + L2)" should read -- L1/(L1+ L2) --.

Column 26,
Lines 6-16, "L1(L1+ L2)" should read -- L1/(L1+ L2) --.

Signed and Sealed this

Twenty-seventh Day of September, 2005

JON W. DUDAS
*Director of the United States Patent and Trademark Office*